US007545141B2

(12) United States Patent
Kimura

(10) Patent No.: US 7,545,141 B2
(45) Date of Patent: Jun. 9, 2009

(54) MRI APPARATUS AND ASL IMAGING TECHNIQUE

(75) Inventor: Tokunori Kimura, Yaita (JP)

(73) Assignees: Kabushiki Kaisha Toshiba, Minato-ku, Tokyo (JP); Toshiiba Medical Systems Corporation, Otawara-shi, Tochigi-ken (JP)

( * ) Notice: Subject to any disclaimer, the term of this patent is extended or adjusted under 35 U.S.C. 154(b) by 801 days.

(21) Appl. No.: 10/775,131

(22) Filed: Feb. 11, 2004

(65) Prior Publication Data

US 2004/0162483 A1 Aug. 19, 2004

(30) Foreign Application Priority Data

Feb. 14, 2003 (JP) .............................. 2003-037183

(51) Int. Cl.
*G01V 3/00* (2006.01)
(52) U.S. Cl. ........................ 324/306; 324/307; 324/309
(58) Field of Classification Search ......... 600/407–410, 600/413, 416, 419; 324/318–322, 306, 307, 324/309
See application file for complete search history.

(56) References Cited

U.S. PATENT DOCUMENTS

| 5,417,214 | A  | * | 5/1995  | Roberts et al. ............... 600/413 |
| 5,492,123 | A  | * | 2/1996  | Edelman ...................... 600/410 |
| 6,564,080 | B1 | * | 5/2003  | Kimura ....................... 600/410 |
| 6,618,609 | B2 | * | 9/2003  | Liu et al. ..................... 600/419 |
| 6,717,405 | B2 | * | 4/2004  | Alsop ......................... 324/306 |
| 6,980,001 | B2 | * | 12/2005 | Paley et al. .................. 324/318 |
| 7,069,068 | B1 | * | 6/2006  | Ostergaard ................... 600/420 |
| 7,328,054 | B2 | * | 2/2008  | Jesmanowicz ............... 600/410 |
| 2003/0193334 | A1 | * | 10/2003 | Alsop ......................... 324/306 |
| 2004/0162483 | A1 | * | 8/2004  | Kimura ....................... 600/419 |

OTHER PUBLICATIONS

Wong et al., "Velocity Selective Arterial Spin Labeling," Proc. Intl. Soc. Mag. Reson. Med 19 (2002).
Duhamel et al., "Evaluation of Systematic Quantification Errors in Velocity Selective Arterial Spin Labeling of the Brain", Magnetic Resonance in Medicine 50: 145-153 (2003).

* cited by examiner

*Primary Examiner*—Long V Le
*Assistant Examiner*—Sanjay Cattungal
(74) *Attorney, Agent, or Firm*—Nixon & Vanderhye PC

(57) ABSTRACT

An MRI apparatus obtains an ASL (Arterial Spin Labeling) image of a region to be imaged in a subject by performing a scan to the region to be imaged independently in a control mode and in a tag mode according to a pulse sequence based on an ASL technique. The pulse sequence includes a velocity-selective pulse, BVS (Band-limited Velocity-Selective)-pulse, that selectively excites magnetization spins in a blood flow passing through the region to be imaged and having a constant velocity range for the spins to undergo transition to transverse magnetization, and then performs excitation to cause the transverse magnetization to flip back to longitudinal magnetization. The velocity-selective pulse is formed in such a manner that the transverse magnetization excited in each of the control mode and the tag mode gives rise to a phase shift in an opposite polarity upon velocity-selective excitation.

10 Claims, 17 Drawing Sheets

SLICE-SELECTIVE MODIFICATION OF VS-ASL TECHNIQUE OF UNIPOLAR-VENC TYPE

MEASUREMENT BY PHASE-MEASURING PULSE SEQUENCE
(IN EACH OF CONTROL AND TAG MODES)

COMPUTATION OF PHASE DISTRIBUTION
(IN EACH OF CONTROL AND TAG MODES)

SEQUENCE AFTER PHASE COMPENSATION
(IN EACH OF CONTROL AND TAG MODES)

FLIP-BACK PHASE (IN CONTROL/TAG MODE)

MEASUREMENT BY PHASE-MEASURING PULSE SEQUENCE
(IN EACH OF CONTROL AND TAG MODES)

COMPUTATION OF PHASE DISTRIBUTION
(IN EACH OF CONTROL AND TAG MODES)

SEQUENCE AFTER PHASE COMPENSATION
(QUANTITY OF COMPENSATION, Gz2, IS
COMMON IN CONTROL AND TAG MODES)

FLIP-BACK PHASE (IN CONTROL/TAG MODE)

MRI APPARATUS AND ASL IMAGING TECHNIQUE

BACKGROUND OF THE INVENTION

1. Technical Field of the Invention

The present invention relates to imaging based on the ASL (Arterial Spin Labeling) technique, ASL imaging, capable of providing images of perfusion (tissue blood flows) or blood vessels non-invasively without administrating a contrast medium to the subject. More particularly, the invention relates to an MRI (Magnetic Resonance Imaging) apparatus and the ASL imaging technique capable of performing the ASL imaging that reduces errors induced by a time needed for a blood flow to pass through the path from the label region to the tissue of interest in the imaging region (that is, transit delay time), which is intrinsic to the slice-selective ASL technique.

The ASL technique referred to herein means the general spin labeling technique in the broad sense.

2. Related Arts

Magnetic resonance imaging is a technique involving magnetically exciting nuclear spins in a subject laid in a static magnetic field using a high frequency signal at the Larmor frequency, and obtaining images from excitation-induced FID (Free Induction Decay) signals or echo signals.

The spin labeling technique for evaluating perfusion of tissue, the so-called ASL technique, has been known as one category of magnetic resonance imaging. The ASL technique is used to provide images of blood veins or images of perfusion (tissue blood flows) reflecting microcirculation of the subject without administrating a contrast medium to the subject, that is, non-invasively, on which studies have been conducted actively in recent years. in particular, clinical applications are being developed chiefly for cerebral blood flow (CBF) of the head, and quantification of a blood flow volume is being enabled.

The ASL technique is broadly divided into the continuous ASL (CASL) technique and the pulsed ASL (PASL) technique (referred to also as the dynamic ASL (DASL) technique). The CASL technique is used to apply a large continuous adiabatic RF wave, by which a spin state in the blood vessel is labeled (magnetized) at a given point, and a change of the signal after the bolus of the labeled blood reaches the imaging slab (observation plane) is subjected to imaging. On the other hand, the PASL technique is used to apply a pulsed adiabatic RF wave, by which the magnetization in the blood vessel is constantly varied, and the tissue persistently susceptible to the magnetized blood flow is subjected to imaging, thereby enabling perfusion of this tissue to be evaluated. The PASL technique can be performed in a relatively easy manner with a clinical MRI apparatus.

Generally, two images are generated in the ASL imaging: images in a control mode and in a label (tag) mode. The image data obtained in each of the tag mode and the control mode is subjected to a pixel-by-pixel difference operation between these two images. An ASL image indicative of information of inflowing blood to the imaging slab, that is, microcirculation, can be thus obtained.

To be more specific, according to the ASL imaging, signals from the stationary tissue are generally cancelled and signals from the spins flowing into the capillary bed are obtained as a blood flow image. Hence, a difference image is obtained by computing a difference between a tag image taken after waiting for a certain time until the artery labeled in the tag region flows into the tissue of interest in the imaging region and a control image taken under the same conditions as those of the tag image without the labeling, and the difference image thus obtained is used as a blood flow image, that is, an ASL image.

Recently, there have been proposed various techniques of slice-selectively labeling an upstream artery outside the range of the slab to be imaged. Of these techniques, Article[1], Kwong K K, Chesler D A, Koff R M, Donahue K M et al.: MR perfusion studies with T1-weighted echo planar imaging, *Magn Reson Med* 1995; 34:878-887, and Article[2], Tokunori Kimura: Modified STAR using asymmetric inversion slabs (ASTAR)-hou niyoru hi-shinjyuu ketsuryuu imaging, *JJMR (Japanese Journal of Magnetic Resonance in Medicine)* (Nichijii-shi) 2001; 20(8), 374-385, are known as techniques for the PASL technique. On the other hand, for example, Article[3], Alsop D C, Detre J A: Reduced transit-time sensitivity in non-invasive magnetic resonance imaging of human cerebral blood flow, *J.Cereb.Blood Flow Metab.* 1996; 16, 1223-1249, is known as a technique for the CASL technique. These techniques are leading the SS-ASL (Slice Selective-ASL) to medical applications.

FIG. 1 schematically shows pulse imaging by the SS-ASL technique. As is shown in the drawing, in each of the control mode and the tag mode, a slice-selective pulse (SS-pulse), comprising an RF pulse and a slice gradient magnetic field Gs, is applied to the subject, and scan is performed to the imaging region after waiting for a certain inversion time T1. In FIG. 1, a solid line indicates the waveform of the slice gradient magnetic field Gs in the control mode and a broken line in the tag mode.

Normally, a living body has a characteristic that, in a path from the large blood vessel to the peripheral artery, the velocity of a blood flow flowing in the path is reduced with an increase of an average capacity of the blood vessel per unit volume. For this reason, a time needed for the blood flow to pass through the path from the tag region used for labeling to the tissue of interest in the imaging region (referred to as the transit delay time, abbreviated to Td) is not negligible in many cases.

In a case where the Td time cannot be neglected in comparison with the T1 relaxation (longitudinal relaxation) of labeled water (that is, when Td>T1), the labeled blood cannot reach the tissue of interest within the TI time, a time period from labeling to imaging of the upstream arterial blood, while maintaining sufficient longitudinal magnetization for imaging. The blood flow in the imaging region is thus under evaluated. Because the slice-selective ASL (SS-ASL) cannot, in principle, label a blood vessel within the imaging slab, this influence becomes particularly significant when the entire brain is to be covered by multi-slice imaging. Even in such a case, Article[4], Tokunori Kimura et al.: Arterial Spin Labeling imaging niokeru kyokusho nouketsuryuuryou no teiryouka kanben-hou-Pulsed ASL-hou niokeru simulation to cold-xenon-CT CBF tono soukan, *JJMR* (Nichijii-shi), 2002; 22(3): 111-124, reports that an ASL image with satisfactory accuracy can be obtained by the SS-ASL with a normal subject whose blood flow velocity is high. However, in cases like the cerebral infarction where the blood flow velocity is reduced or where the Td time is extended due to a collateral vessel, the blood flow cannot reach the region of interest in the imaging region within the TI time, 1 to 2 sec. after the labeling. The flow is thus often under evaluated, which is reported as an issue of concern.

In order to reduce the influence of the Td time, a technique of capable of labeling the blood within the imaging slab has been proposed. This is a technique used to selectively label the spins in the flow at a given velocity or higher, and is proposed in Article[5], Norris D G et al., Velocity Selective Radio frequency Pulse Trains, *J. Magn. Res*. 1999; 137, 231-

236. The result when this technique was applied in generating an ASL image of the brain of a normal subject was reported by E. Wong et al. in the 2002 meeting of the ISMRM as is described in Article[6], Wong E C et al.: Velocity Selective Arterial Spin Labeling, Abst Int Magn Res Med 2002; p621.

The ASL imaging technique according to Article[5] and Article[6] above is a technique (Velocity-Selective ASL, abbreviated to VS-ASL) used to label a blood vessel in proximity to the vascular bed within the slab where the velocity is low, using a velocity-selective pulse capable of labeling a blood flow flowing at a certain velocity value or higher.

FIG. 2 shows a schematic pulse sequence according to the VS-ASL technique. As is shown in the drawing, in the case of the VS-ASL technique, non-slice-selective 90° (x)–180° (y)–90° (−x) RF pulses are applied as the velocity-selective pulse (VS-pulse) in the control mode. On the other hand, in the tag mode, a pulse group, formed by adding a velocity encode pulse train, which is an MPG pulse, to the 90° (x)–180° (y)–90° (−x) RF pulses, is applied as the velocity-selective pulse (VS-pulse) This provides the control image and the tag image in the control mode and the tag mode, respectively, and a difference between the two images is computed. A difference image thus obtained is used as an ASL image. In this ASL image, spins having a flow velocity v=Venc (the flow velocity at which spins, having undergone transition to the transverse magnetization by the velocity encode pulse train, are rotated by 90°) or higher are excited (saturated). Because magnetization (Mz) of spins at v>Venc takes place only on the one side (in the control mode) according to this VS-ASL technique, hereinafter, this technique is referred to as the VS-ASL technique of a unipolar-VENC type (abbreviated to UVS-ASL technique).

The UVS-ASL technique, however, has unsolved problems as follows.

(1) A first unsolved problem is low sensitivity. To be more specific, the labeling effect of the magnetization Mz is increased by two times in the conventional SS-ASL technique, whereas the sensitivity is increased by one time or less in the UVS-ASL technique, which is lower than the sensitivity in the SS-ASL technique.

(2) A second unsolved problem is an artifact. To be more specific, in the UVS-ASL technique, there occurs unbalanced spoiling of the transverse magnetization components caused by setting MPG=0 in the control mode, that is, phase errors that result in a second-order spatial distribution induced by gradient magnetic field components in directions other than the main magnetic field direction, and the phase errors appear as artifacts remaining in the stationary tissue (background) where no flow should be present in an ASL image, thereby deteriorating the image quality.

(3) A third unsolved problem is extension of an imaging time. In general, because the ASL technique involves the averaging processing, plural sets of data are acquired and subjected to averaging. In other words, a pulse sequence of one cycle is applied repetitively a plurality of times at regular intervals. When the averaging processing is adapted to the UVS-ASL technique, because the UVS-ASL technique is non-slice-selective, it is necessary to secure a sufficiently long recovery time for the magnetization in blood to flip back to the longitudinal magnetization after a pulse sequence of one cycle is applied and before a pulse train in the following mode is applied. This results in a problem that a scan time is extended. In particular, in a case where RF transmission is performed using a whole body coil, because region including the heart is also excited by the RF pulses, the scan (imaging time) is extended.

SUMMARY OF THE INVENTION

The invention was devised in view of the problems of the UVS-ASL technique (the VS-ASL technique of the unipolar-VENC type) described above, and a first object of the invention is therefore to provide ASL imaging of a velocity-selective type, capable of reducing Td time-induced errors as well as increasing the sensitivity by the labeling effect of magnetization as high as that in the conventional SS-ASL technique.

Also, a second object of the invention is to provide ASL imaging not only achieving the first object described above, but also enabling the labeling of blood flows in a broad range from a low velocity to a high velocity, and thereby eliminating the need to limit a velocity range of a blood flow to be labeled.

Further, a third object of the invention is to improve the image quality or the visualization capability by compensating for a spatial distribution of the phases of spins caused by a velocity-selective pulse when the ASL imaging is performed with the use of the velocity-selective pulse.

In order to achieve the first object, a first aspect of an MRI apparatus of the invention is an MRI apparatus configured to obtain an ASL (Arterial Spin Labeling) image of a region to be imaged in a subject by performing a scan to the region to be imaged independently in a control mode and in a tag mode according to a pulse sequence based on an ASL technique. The MRI apparatus is characterized in that: the pulse sequence is set with a velocity-selective pulse that selectively excites magnetization spins in a fluid passing through the region to be imaged and having a constant velocity range for the spins to undergo transition to transverse magnetization, and then performs excitation to cause the transverse magnetization to flip back to longitudinal magnetization; and the velocity-selective pulse is formed in such a manner that the longitudinal magnetization excited in each of the control mode and the tag mode is reversed in polarity upon velocity-selective excitation by the velocity-selective pulse. It should be noted that the invention provides the ASL imaging technique that exhibits a function equivalent to the function of the configuration described above.

By causing a phase shift in an opposite polarity in the transverse magnetization excited in each of the control mode and the tag mode in this manner, the magnetization components in the fluid are reversed in polarity when the transverse magnetization flips back to the longitudinal magnetization. Hence, when an ASL image is generated by computing a difference between the control mode and the tag mode, the signal value is increased by nearly two times.

For example, the velocity-selective pulse may be either non-slice-selective or slice-selective. In the case of being slice-selective, the velocity-selective pulse includes, for example, a first flip pulse applied first on a time axis, an inversion pulse applied after the first flip pulse, a second flip pulse applied after the inversion pulse, a velocity encode pulse applied in a period after the first flip pulse is applied and before the inversion pulse is applied and in a period after the inversion pulse is applied and before the second flip pulse is applied, and a gradient magnetic field pulse that is applied together with the first and second flip pulses as well as the inversion pulse and spatially selects a region including the region to be imaged.

It is preferable that each of the first and second flip pulses is a 90° RF pulse, and the inversion pulse is a 180° RF pulse.

In this case, for example, it may be arranged in such a manner that the polarity of the velocity encode pulse is reversed between the control mode and the tag mode and the second flip pulse is set to a same flip phase in the both modes, or alternatively, the velocity encode pulse is set to a same polarity in both of the control mode and the tag mode, and a flip phase of the first or second flip pulse is inverted between the modes.

In order to achieve the second object, another aspect of the MRI apparatus of the invention is an MRI apparatus configured to obtain an ASL (Arterial Spin Labeling) image of a region to be imaged in a subject by performing a scan to the region to be imaged independently in a control mode and in a tag mode according to a pulse sequence based on an ASL technique. The MRI apparatus is characterized in that the pulse sequence includes a slice-selective pulse that spatially selects a region outside the region to be imaged and excites magnetization spins within the region for the spins to undergo transition to transverse magnetization, and a velocity-selective pulse that selectively excites magnetization spins in a fluid passing through the region to be imaged and having a constant velocity range for the spins to undergo transition to transverse magnetization, and then performs excitation to cause the transverse magnetization to flip back to longitudinal magnetization. It should be noted that the invention provides the ASL imaging technique that exhibits a function equivalent to the function of the configuration described above.

According to this configuration, fluid imaging with better quantification can be provided in the ASL imaging, which is non-invasive blood flow imaging by MRI. In other words, it is possible to reduce errors induced by a Td time (transit delay time), which is the most serious problem in the existing slice-selective ASL technique. To be more specific, by combining the velocity selection and the slice selection, a fluid (blood flow or the like) having a high flow velocity can be labeled with the slice-selective pulse, and a fluid (blood flow or the like) with in a region to be imaged having a relatively low flow velocity can be labeled with the velocity-selective pulse. This makes it possible to achieve the labeling sensitivity (SNR) about two times higher than that of the existing ASL imaging according to the velocity-selective technique.

In order to achieve the third object, a further aspect of the MRI apparatus of the invention is an MRI apparatus, which is characterized by being provided with: means for obtaining an ASL (Arterial Spin Labeling) image of a region to be imaged in a subject by performing a scan to the region to be imaged independently in a control mode and in a tag mode according to a pulse sequence based on an ASL technique, the pulse sequence being formed to include a velocity-selective pulse that selectively excites magnetization spins in a fluid passing through the region to be imaged and having a constant velocity region for the spins to undergo transition to transverse magnetization, and then performs excitation to cause the transverse magnetization to flip back to longitudinal magnetization; phase compensation quantity computing means for finding a quantity of compensation for a phase of the velocity-selective pulse; and phase compensating means for reflecting the quantity of compensation computed by the phase compensation quantity computing means to the pulse sequence. It should be noted that the invention provides the ASL imaging technique that is furnished with a function equivalent to the function described above.

More concrete configurations and features according to other aspects of the invention will become apparent from the descriptions of embodiments of the invention below and accompanying drawings.

DETAILED DESCRIPTION OF THE PREFERRED EMBODIMENTS

Embodiments of the invention will now be described with reference to the accompanying drawings.

First Embodiment

A first embodiment of the invention will be described with reference to FIG. 3 through FIG. 12.

Figure 1:
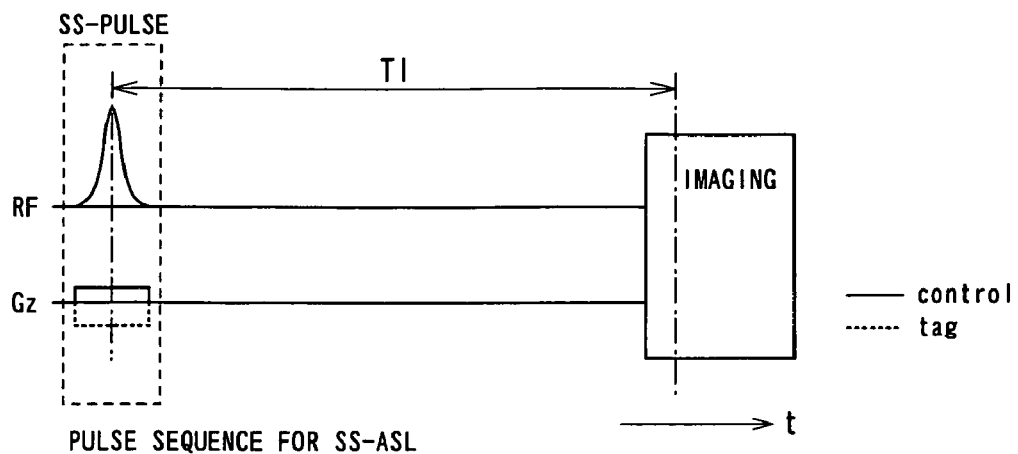
FIG. 1 shows a pulse sequence used to explain the outline of the SS-ASL technique according to a conventional example.
Figure 2:
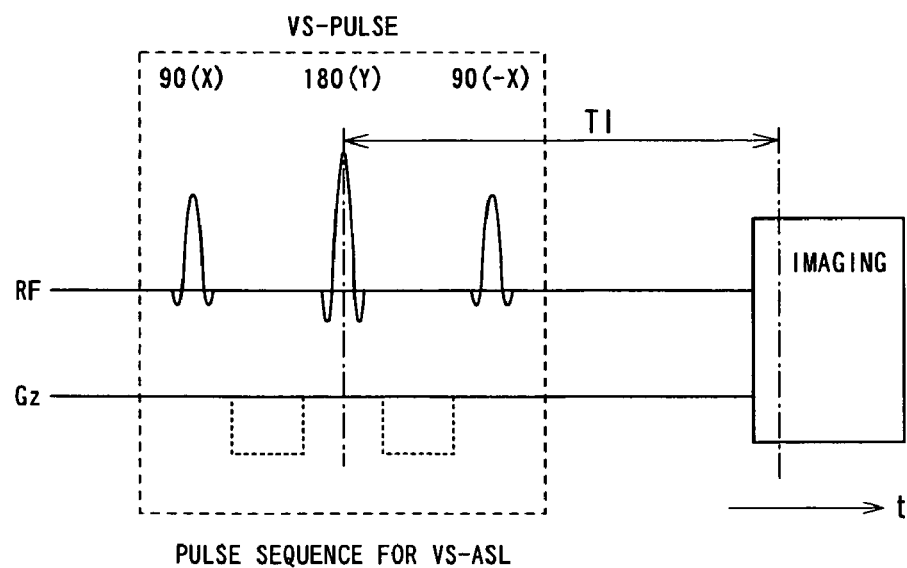
FIG. 2 shows a pulse sequence used to explain the outline of the VS-ASL technique according to another conventional example.
Figure 3:
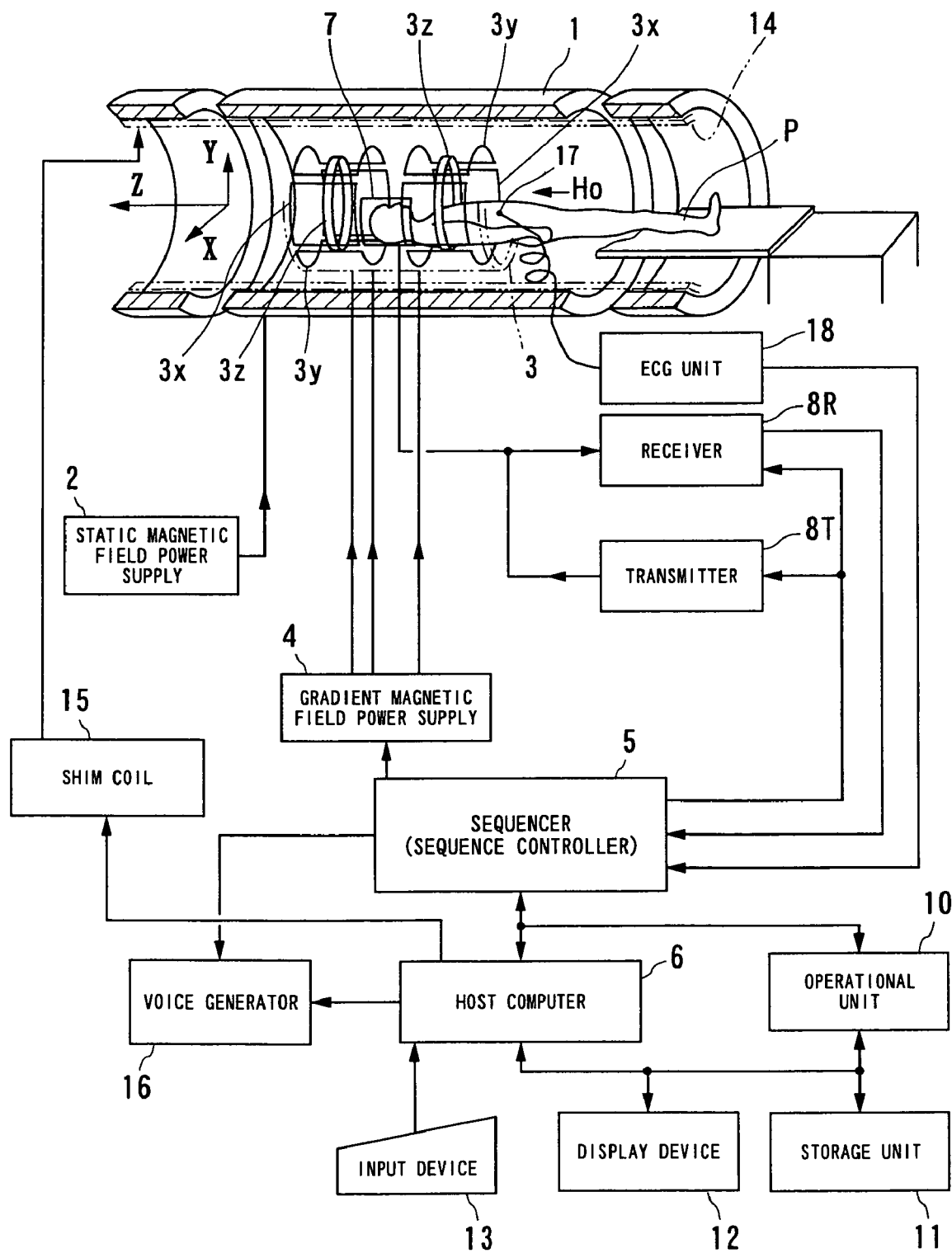
FIG. 3 is a block diagram schematically showing an overall MRI apparatus performing ASL imaging according to embodiments of the invention.

FIG. 3 shows an MRI apparatus according to the first embodiment. The MRI apparatus is furnished with a function of performing ASL imaging of various types of the invention.

Initially, the schematic configuration of the MRI apparatus will be described.

The MRI apparatus includes a patient couch portion on which the subject P is laid down, a static magnetic field generating portion generating a static magnetic field, a gradient magnetic field generating portion appending position information to a static magnetic field, a transmission and reception portion transmitting and receiving a high frequency signal, and a control and operation portion responsible for the control of the overall system and image reconstruction.

The static magnetic field generating portion includes a magnet 1, for example, of a super-conducting type, and a static magnetic field power supply 2 supplying the magnet 1 with a current, and it generates a static magnetic field $H_0$ along the axial direction (Z-axis direction) of a cylindrical aperture (diagnostic space) into which the patient P is inserted. The magnet portion is provided with a shim coil 14. A current for homogenizing the static magnetic field is supplied to the shim coil 14 from a shim coil power supply 15 under the control of a controller described below. The patient couch portion can insert the patient couch top on which the patient P is laid down into the aperture of the magnet 1 in such a manner that it can be withdrawn.

The gradient magnetic field generating portion includes a gradient magnetic field coil unit 3 incorporated into the magnet 1. The gradient magnetic field coil unit 3 includes three sets (kinds) of coils, x-, y-, and z-coils $3x$ through $3z$ to generate gradient magnetic fields along the X-, Y-, and Z-axis directions that are orthogonal with respect to one another. The gradient magnetic field generating portion further includes a gradient magnetic field power supply 4 supplying the x-, y-, and z-coils $3x$ through $3z$ with a current. The gradient magnetic field power supply 4 supplies the x-, y-, and z-coils $3x$ through $3z$ with a pulsed current used for generating gradient magnetic fields, under the control of a sequencer 5 described below.

By controlling a pulsed current supplied to the x-, y-, and z-coils $3x$ through $3z$ from the gradient magnetic field power supply 4, the gradient magnetic fields in the X-, Y-, and Z-directions, representing three physical axes, are synthesized, which makes it possible to set and change, as needed, the respective directions of logical axes, that is, the directions of a slice gradient magnetic field Gs, a phase encode gradient magnetic field Ge, and a read (frequency encode) gradient magnetic field Gr. The gradient magnetic fields in the slice direction, the phase encode direction, and the read direction are all superimposed on the static magnetic field $H_0$.

The transmission and reception portion includes an RF coil 7 provided in close proximity to the subject P in an imaging space inside the magnet 1, and a transmitter 8T and a receiver 8R both connected to the coil 7. The transmitter 8T and the receiver 8R are formed in such a manner that, under the control of the sequencer 5 described below, the former supplies the RF coil 7 with an RF current pulse at the Larmor frequency for a magnetic resonance (MR) phenomenon to occur while the latter receives high frequency MR signals received at the RF coil 7 and produces corresponding digital signals by applying various kinds of signal processing to the received signals.

Further, the control and operation portion includes the sequencer (referred to also as sequence controller) 5, a host computer 6, an operational unit 10, a storage unit 11, a display device 12, and an input device 13. Of these, the host computer 6 is furnished with a function of accepting information from the operator and provides scan sequence information based on this information as a command to the sequencer 5, while controlling the operations of the overall apparatus including the operational unit 10, the storage unit 11, and the display device 12 in addition to the sequencer 5, according to the pre-stored software procedure.

The sequencer 5 includes a CPU and a memory, and thereby stores the pulse sequence information sent from the host computer 6 and controls a series of operations of the gradient magnetic field power supply 4, the transmitter 8T, and the receiver 8R according to the stored information. Also, the sequencer 5 temporarily receives digital data of the MR signals from the receiver 8R, and transfers the data later to the operational unit 10 that performs reconstruction processing.

The pulse sequence information referred to herein is defined as all the information necessary to activate the gradient magnetic field power supply 4, the transmitter 8T, and the receiver 8R according to a series of pulses in the pulse sequence, and includes, for example, information related to the strength, duration, application timing, etc. of a pulsed current to be applied to the x-, y-, and z-coils $3x$ through $3z$.

The ASL imaging technique of this embodiment can use any technique, such as the ASTAR technique, the STAR technique, the EPISTAR technique, and the FAIR technique. Also, an imaging pulse sequence to be applied a certain time TI later, which is adoptable in any of the foregoing techniques, can be any pulse sequence as long as it is a fast imaging pulse sequence by which the magnitude of the longitudinal magnetization is enhanced. Examples of available pulse sequences are those used in the fast FE method, the fast SE method, the EPI (Echo Planar Imaging) method, the FASE (Fast Asymmetric SE) method, the hybrid EPI method, the SSFP method, etc.

The operational unit 10 is for med to perform, in an adequate order, reading of inputted raw data, mapping of the raw data in the Fourier space (referred to also as the k space or the frequency space) of an image, data averaging processing, computation of a data difference between the tag mode and the control mode, data processing with a threshold, computation of an absolute value of complex-number data, and reconstruction processing for reconstructing raw data into actual spatial data (for example, 2-D or 3-D Fourier transform). In the case of 3-D imaging, the operational unit 10 is also able to perform MIP (Maximum Intensity Projection) and the like to generate 2-D image data from 3-D image data.

The storage unit 11 is able to save not only the raw data and reconstruction image data, but also image data having undergone the operational processing. The display device 12 displays an image. Also, the operator is able to input necessary information, including desired scan conditions, scan sequences, and kinds of image processing, into the host computer 6 via the input device 13.

The BVS-ASL (Band-limited Velocity ASL) technique performed in the first embodiment will now be described.

The BVS-ASL technique is a novel ASL technique devised in solving the problems in the UVS-ASL technique (the VS-ASL technique of the unipolar-VENC type) described above. The velocity of blood to be labeled is limited to a certain velocity range; however, this ASL technique can attain signal sensitivity about two times higher than that of the UVS-ASL technique.

In the BVS-ASL technique, the control slab and the tag slab are subjected to slice-selective RF excitation, using the BVS (Band-limited Velocity-Selective) pulse: BVS-pulse as a velocity-selective pulse, in the control mode and the tag mode, respectively. At the time of RF excitation, the RF pulse and the velocity encode pulse (for example, the MPG (Motion Probing Gradient) pulse) VENC are set so that the flowing spins are excited in a velocity region from 0 to 2*Venc with the flow velocity v=Venc at the peak while the stationary spins (flow velocity v=0) remain unexcited.

Figure 4:
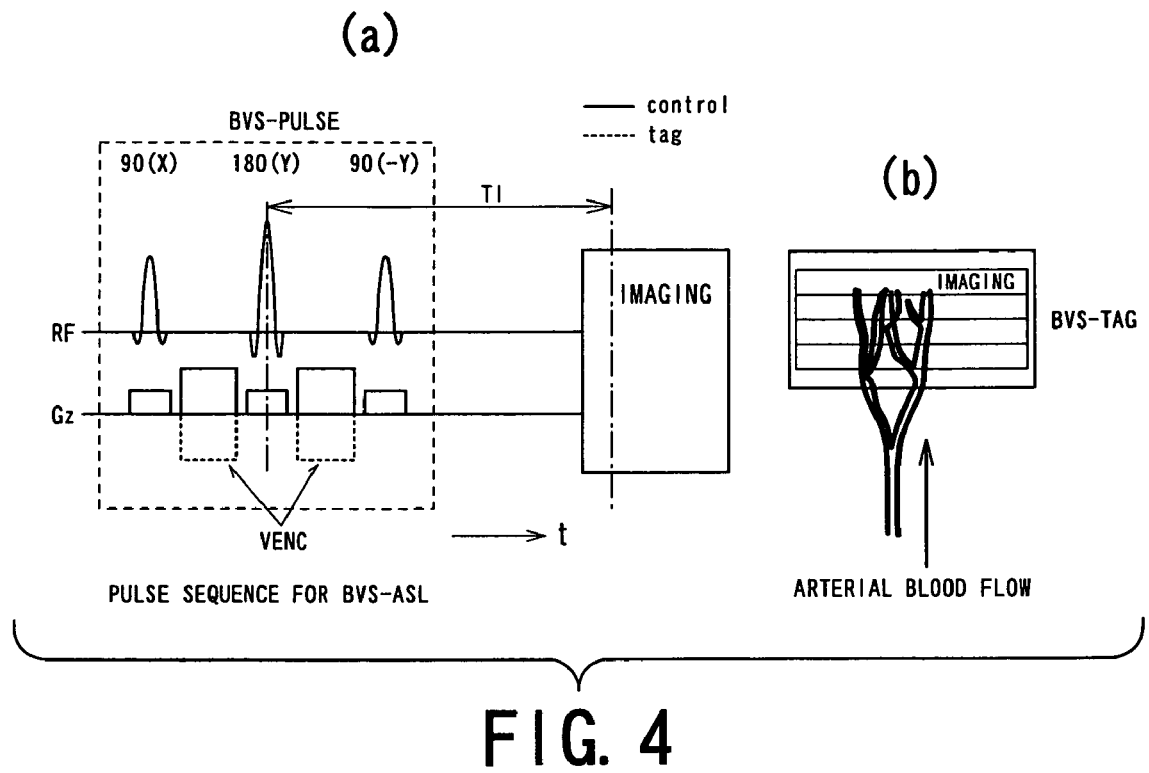
FIG. 4 is a view used to explain a schematic pulse sequence and the position of a tag slab in one example of a BVS (Band-limited Velocity-Selective)-ASL technique feasible in a first embodiment of the invention.
Figure 5:
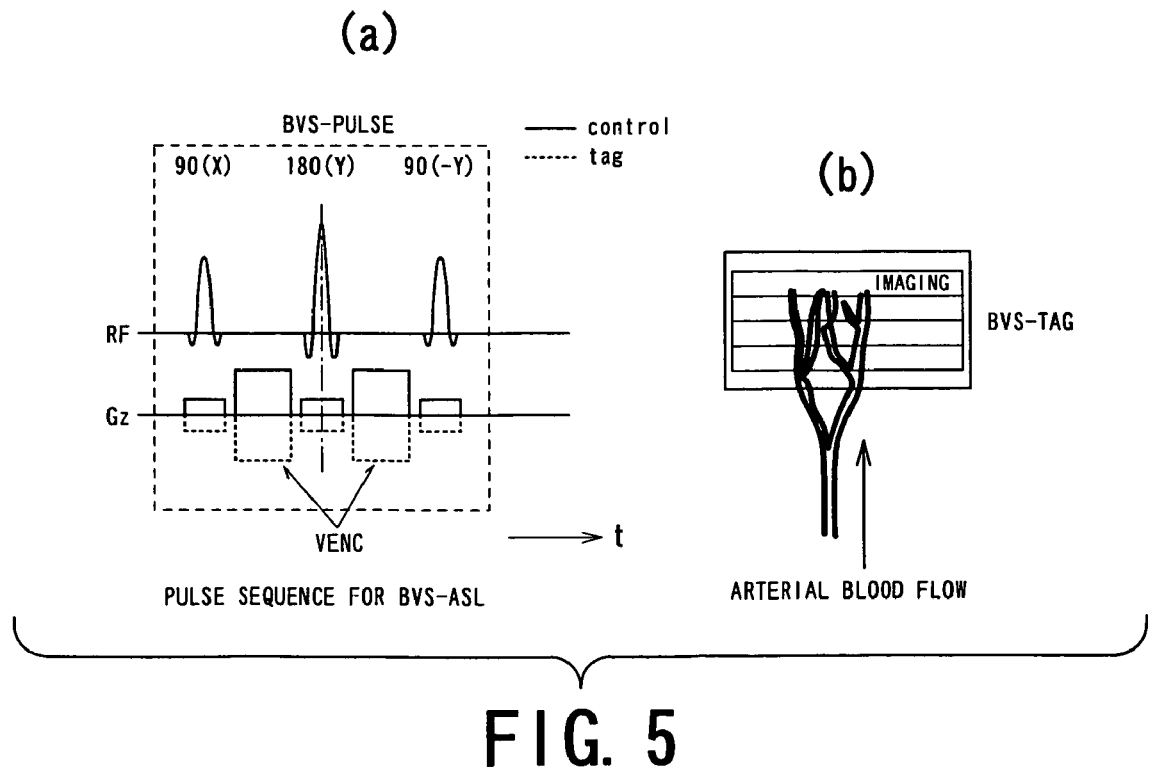
FIG. 5 is a view used to explain a schematic pulse sequence and the position of a tag slab in another example of the BVS-ASL technique feasible in the first embodiment.
Figure 6:
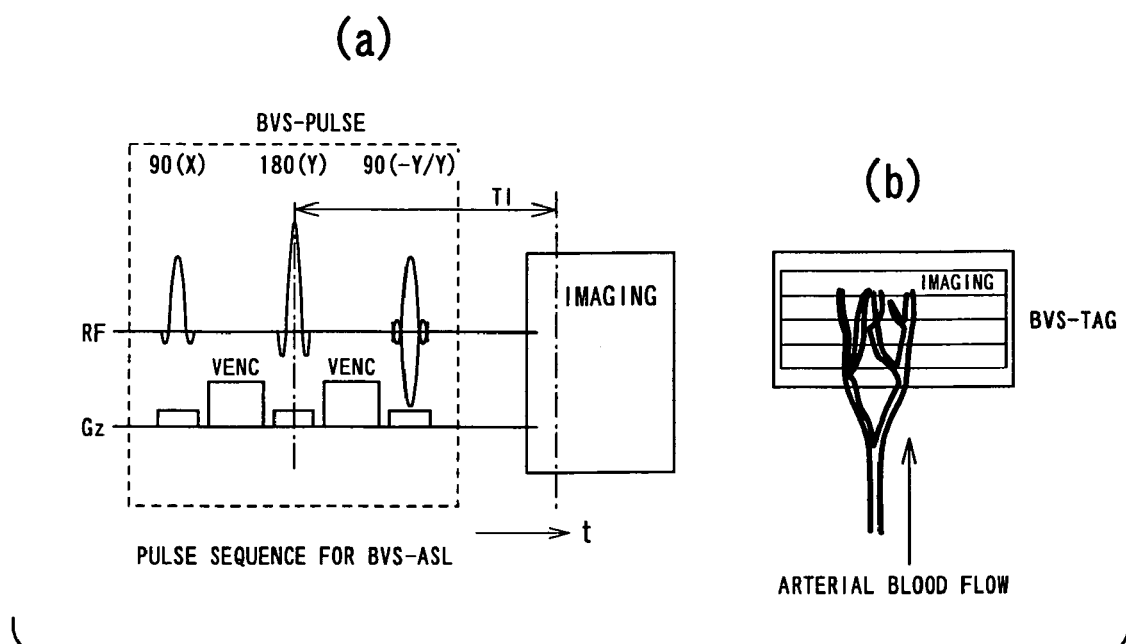
FIG. 6 is a view used to explain a schematic pulse sequence and the position of a tag slab in a still another example of the BVS-ASL technique feasible in the first embodiment.

The velocity-selective pulse: BVS-pulse includes several types as are shown in FIG. 4 through FIG. 6 depending on a way in which the RF pulses or the velocity encode pulses VENC are applied. In any type, it is arranged in such a manner that RF pulses having spin flip angles of 90°, 180° and 90° are applied as RF pulses at predetermined intervals together with the slice gradient magnetic field Gz, and the velocity encode pulse VENC is applied between the applications of the RF pulses. Hence, the application strength and the application direction are set so that the flowing spins in the blood flow are excited in the velocity range from 0 to 2*Venc with the velocity v=Venc at the peak.

The velocity-selective pulses: BVS-pulses shown in FIG. 4 through FIG. 6 are divided into two types depending on a way in which the RF pulses are applied.

One type is, as is shown in FIG. 4(a) and FIG. 5(a), a technique of applying the velocity encode pulse (MPG pulse) VENC with the polarity being reversed between the control mode and the tag mode by adopting a 90(X)–180(Y)–90(–Y) RF pulse sequence.

Of these, in the case of the velocity-selective pulse: BVS-pulse of FIG. 4(a), the slice gradient magnetic field Gs for slab selection is applied in the same polarity in both the control mode and the tag mode, and the velocity encode pulse VENC alone is reversed in polarity between the control mode and the tag mode. It should be noted, however, that the amplitude of the velocity encode pulse VENC remains the same in both the control mode and the tag mode. In the case of this BVS-pulse, the slice gradient magnetic field Gs for slab selection applied simultaneously with the RF pulses may be either set to the same polarity or reversed in polarity by making a pair with the velocity encode pulse VENC. In the latter case, velocity encode pulses VENC having the same absolute value can be used. FIG. 4(b) shows a spatial, positional relation between the imaging slab and the tag region excited by the velocity-selective pulse: BVS-pulse of FIG. 4(a) in the tag mode.

In contrast, in the case of the velocity-selective pulse: BVS-pulse of FIG. 5(a), both the slice gradient magnetic field Gz and the velocity encode pulse VENC are reversed in polarity between the control mode and the tag mode. It should be noted, however, that the amplitude of the velocity encode pulse VENC remains the same in both the control mode and the tag mode. FIG. 5(b) shows a spatial, positional relation between the imaging slab and the tag region excited by the velocity selection pulse: BVS-pulse of FIG. 5(a) in the tag mode.

The other type of the velocity-selective pulse: BVS-pulse is, as shown in FIG. 6(a), a technique of maintaining both the slice gradient magnetic field Gz and the velocity encode pulse VENC (MPG pulse) in the same polarity in the control mode and the tag mode, and applying the first or second 90° pulse with the RF phase thereof being inverted between the control mode and the tag mode, by adopting a 90(X)–180(Y)–90(–Y)/90(X)–180(Y)–90(Y) RF pulse sequence. The 90(X)–180(Y)–90(–Y)/90(X)–180(Y)–90(Y) RF pulse sequence indicates that the RF phase of the second 90° pulse is inverted between the control mode and the tag mode. In this case, the RF phase may take 90(–Y) in the control mode and 90(Y) in the tag mode or vice versa. When combined with the SS-ASL technique according to a second embodiment described below, however, it is necessary to control the magnetization Mz of the blood flow to be of the same polarity in each of the control mode and the tag mode. In this case, the phase of the first 90° pulse may be inverted in each of the control mode and the tag mode. For example, the RF phase may be set to 90° (X)–180° (Y)–90° (–Y) in the control mode, and to 90° (–X)–180° (Y)–90° (–Y) in the tag mode.

FIG. 6(b) shows a spatial, positional relation between the imaging slab and the tag region excited by the velocity-selective pulse: BVS-pulse of FIG. 6(a) in the tag mode.

Because the polarity of the magnetization Mz is reversed between the control mode and the tag mode by the BVS-tag, the velocity encode pulse VENC adopted in these velocity-selective pulses: BVS-pulses is hereinafter referred to as the bipolar-VENC.

The imaging processing following the data acquisition includes a step of computing a difference between the control image and the tag image and then computing an absolute value of a difference image. Hence, the combination of polarities of the velocity encode pulse VENC shown in FIG. 4 and FIG. 5 or the combination of the RF phases of the RF pulses shown in FIG. 6 may be in inverse to the foregoing combinations, and any combination can be used as long as the magnetization Mz can be reversed between the control mode and the tag mode.

With reference to FIG. 7A through 7C, FIG. 8, and FIG. 9, the relation among the blood flow, the phase shift of the spin, the longitudinal magnetization Mz in a case where the velocity-selective pulse:BVS-pulse including the bipolar-VENC is applied when performing the BVS-ASL technique will be described.

For the RF magnetic field in the description below, "+X" is defined as a clockwise rotation about the X-axis, and is therefore in inverse to the sign indicating the rotational direction of the spin in the static magnetic field. For the phase of the spin about the $B_0(Z)$-axis, a counterclockwise rotation is defined as positive, and therefore, when the spin moves in the positive direction of the gradient magnetic field, the phase then shifts in the negative direction. For this reason, in the case of the aforementioned RF pulse train, the spin rotates by 90° about the X-axis, 180° about the Y-axis, and finally 90° by the -Y-axis in a clockwise direction toward the center of the coordinate in the left-handed coordinate system. The transverse magnetization receiving the phase shift by the velocity encode pulse VENC (bipolar-VENC) comprising the MPG pulse is thus caused to flip back to the longitudinal magnetization.

Figure 7A:
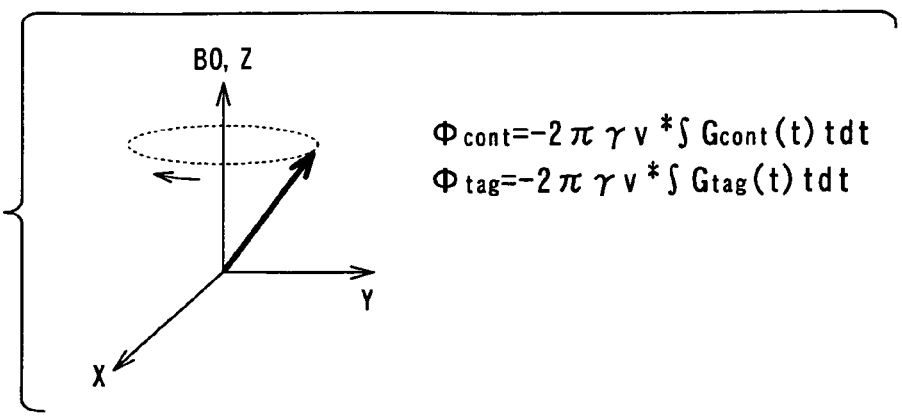
FIG. 7A through FIG. 7C are views used to explain the relation between a velocity-selective pulse and a phase shift in the first embodiment.
Figure 7B:
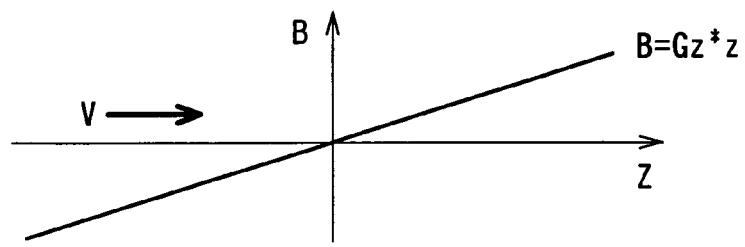
Figure 7C:
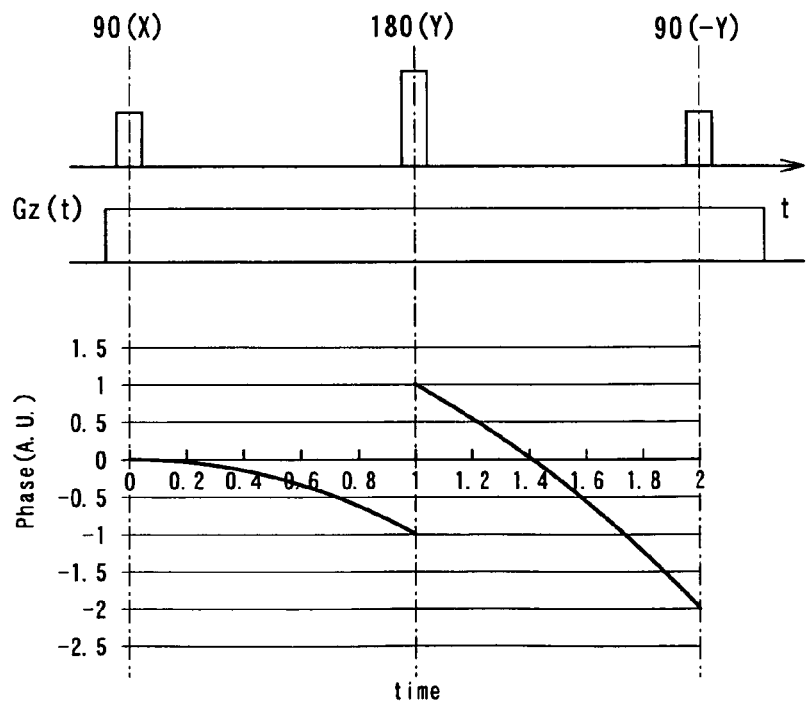

In other words, as are shown in FIG. 7A and FIG. 7B, assume that the gradient magnetic field Gz takes the Z-axis direction as an orientation along which the magnetic field thereof increases, and the velocity encode pulse VENC is set to positive in the control mode and negative in the tag mode. Then, in this case, as is shown in FIG. 7C, the phase of the spin in the blood flow flowing in the positive direction shifts to the negative direction in the control mode immediately before the last 90° pulse is applied, and shifts to the positive direction in the tag mode immediately before the last 90° pulse is applied, in response to the velocity. Also, the phase of the spin in the blood flow flowing in the negative direction shifts to the opposite directions to the aforementioned directions.

Figure 8A:
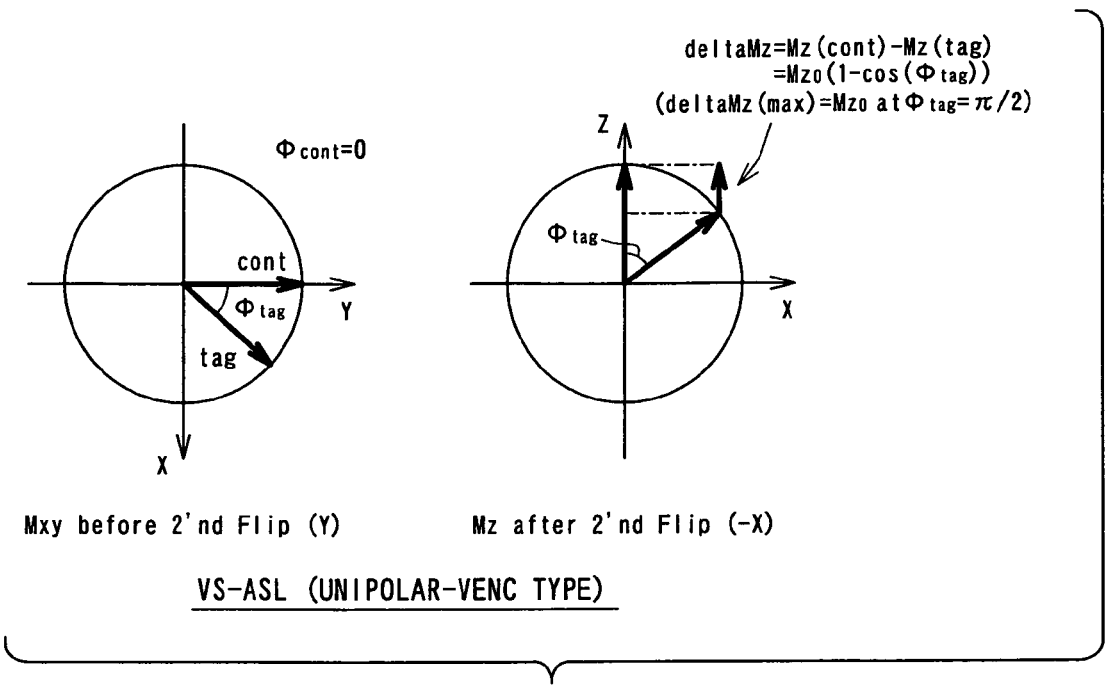
FIG. 8A and FIG. 8B are views used to explain the flipping back to the longitudinal magnetization from the transverse magnetization in the BVS-ASL technique in comparison with the conventional example (UVS-ASL technique)
Figure 8B:
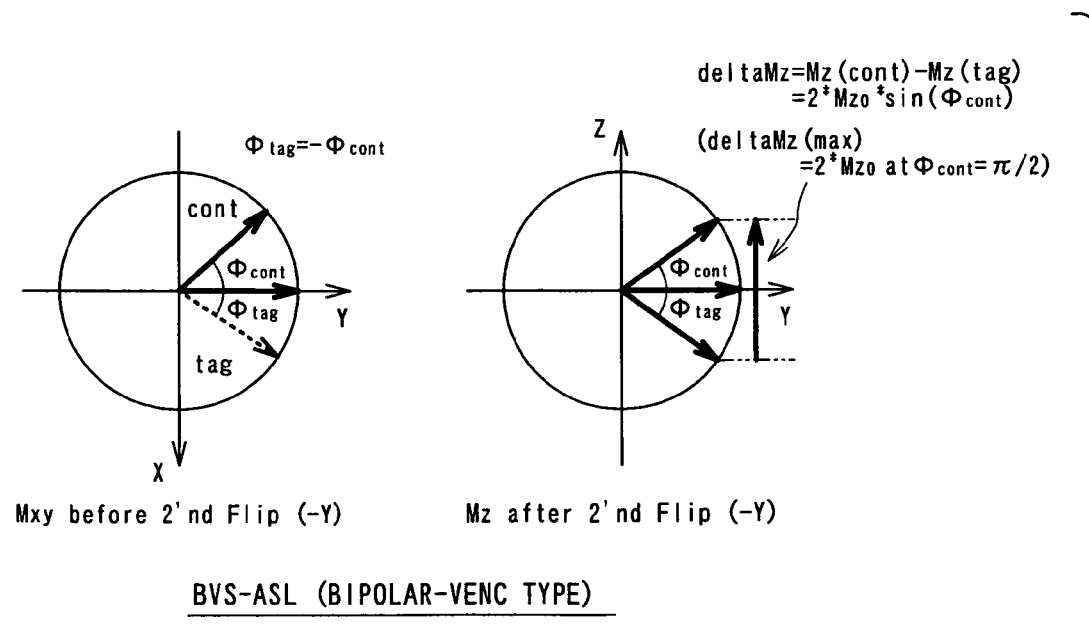

In this manner, the polarity of the phase shift is determined by the polarity of the gradient magnetic field and the direction of the flow; however, the magnetization is controlled to be +Mz in the control mode and −Mz in the tag mode by the last flip pulse (second 90° pulse) (see FIG. 8B, 8A showing the phase shift by the UVS-ASL technique). Given the flow velocity v=Venc, then a +/−90° phase shift occurs in each of the control mode and the tag mode, which gives rise to the longitudinal magnetization Mz having the maximum absolute value immediately after the last flip pulse. On the other hand, because the stationary spins reside on the Y-axis, the longitudinal magnetization Mz thereof immediately after the application of 90(−Y) becomes Mz=0. In the case of a blood flow at a constant velocity, a difference between the control mode and the tag mode shapes the characteristic cosine type where the longitudinal magnetization Mz=0 at v=0 and v=2*Venc, and the longitudinal magnetization Mz=maximum value 2 at v=Venc, and the cosine type on the assumption of the laminar flow (see FIG. 9).

The velocity encode pulse VENC of the bipolar type is also used in the phase contrast (PC) technique, which is now widely used for the flow velocity measurement and the flood flow imaging, and the BVS-ASL technique of the invention also exploits the behavior of the spins as with the PC technique, up to the stage of the transverse magnetization. A significant difference of the BVS-ASL technique is that when the spins are left in the transverse magnetization, it decays due to the T2 relaxation, but the RF pulses are applied in the BVS-ASL technique to cause the transverse magnetization to flip back to the longitudinal magnetization. Causing the transverse magnetization to flip back to the longitudinal magnetization in this manner restores the T2 relaxation to the T1 relaxation, which can in turn extend the relaxation time. The extension of the relaxation time makes it possible to secure a waiting time for the arterial blood labeled in the tag slab to reach the vascular bed, which is necessary for imaging of the region of interest in the imaging slab. To be more specific, the relaxation time of blood is T2=100 to 200 msec. approximately at 1.5 Tesla, which can be extended to T1=1.2 to 1.5 sec. due to the flip back to the longitudinal magnetization. The waiting time TI after the labeling needed for imaging is approximately 1 sec.

The spin echo method is used instead of the gradient echo method in the velocity-selective pulse: BVS-pulse described above. This is because the VS-ASL technique is different from the PC technique in that the phase errors induced by the inhomogeneity of the static magnetic field have to be cancelled across the slab in causing the spins to undergo transition back to the longitudinal magnetization.

Hence, when the inhomogeneity of the static magnetic field is negligible, (for example, when the region of interest FOV is small or the echo time TE is short), it is possible to use the velocity-selective pulse by the gradient echo method instead of the spin echo method.

The effect achieved by the ASL imaging performed by the MRI apparatus of this embodiment will now be described.

The pulse sequence information of the BVS-ASL technique using the velocity-selective pulse: BVS-pulse set in the manner as described above, is sent from the host computer 6 to the sequencer 5. The pulse sequence is formed according to the ASL technique by any adequate known pulse technique, such as the ASTAR (signal targeting with alternated radio frequency using asymmetric inversion slab) technique, the STAR (signal targeting with alternating radio frequency) technique, the EPIATAR (echo-planar MR imaging and signal targeting with alternating radio frequency) technique, and the FAIR (flow sensitive alternating inversion recovery) technique.

Figure 10:
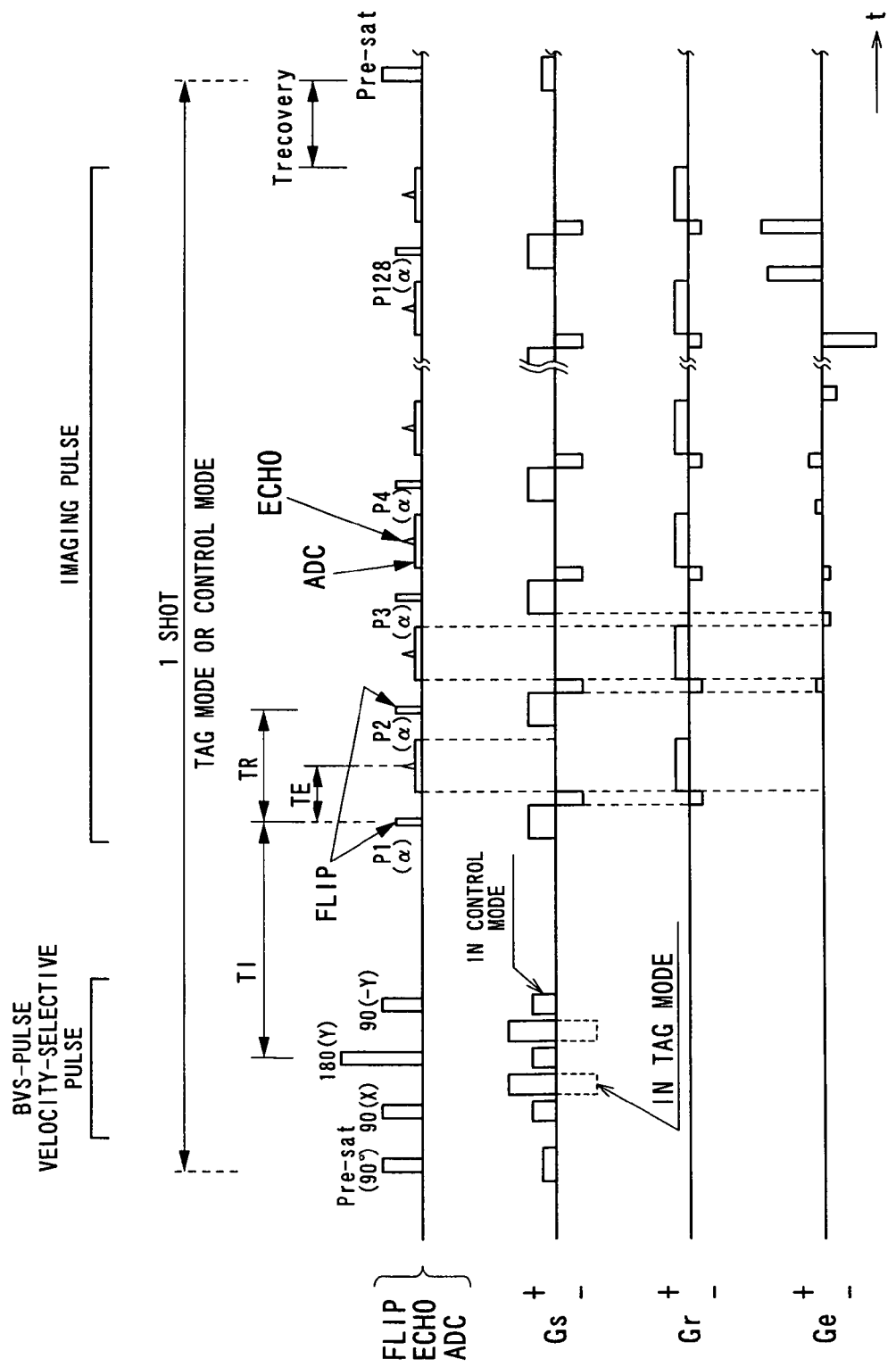
FIG. 10 shows a pulse sequence used to explain one detailed example used in the first embodiment.

FIG. 10 shows one example of such a pulse sequence. The pulse sequence shown in the drawing comprises, by way of example, the velocity-selective pulse: BVS-pulse shown in FIG. 4 and. a 2-D imaging sequence by the fast FE method.

According to the pulse sequence from the host computer 6, the sequencer S drives the units related to the pulse sequence, that is, the gradient magnetic field power supply 4, the transmitter 8T, and the receiver 8R, under its control. The RF pulses and the gradient magnetic field pulses are thereby applied according to the pulse train in the pulse sequence of the BVS-ASL technique, and echo signals are acquired.

For this reason, the pulse sequence shown in FIG. 10 is performed a plurality of times (that is, a plurality of shots) for each slice defining the slab in each of the control mode and the tag mode. The echo signals for one slice are received via the RF coil 7 upon excitation in each shot. Each echo signal is processed into echo data of a digital quantity in the receiver 8R, which is transferred to the operational unit 10 via the sequencer 5.

Figure 11:
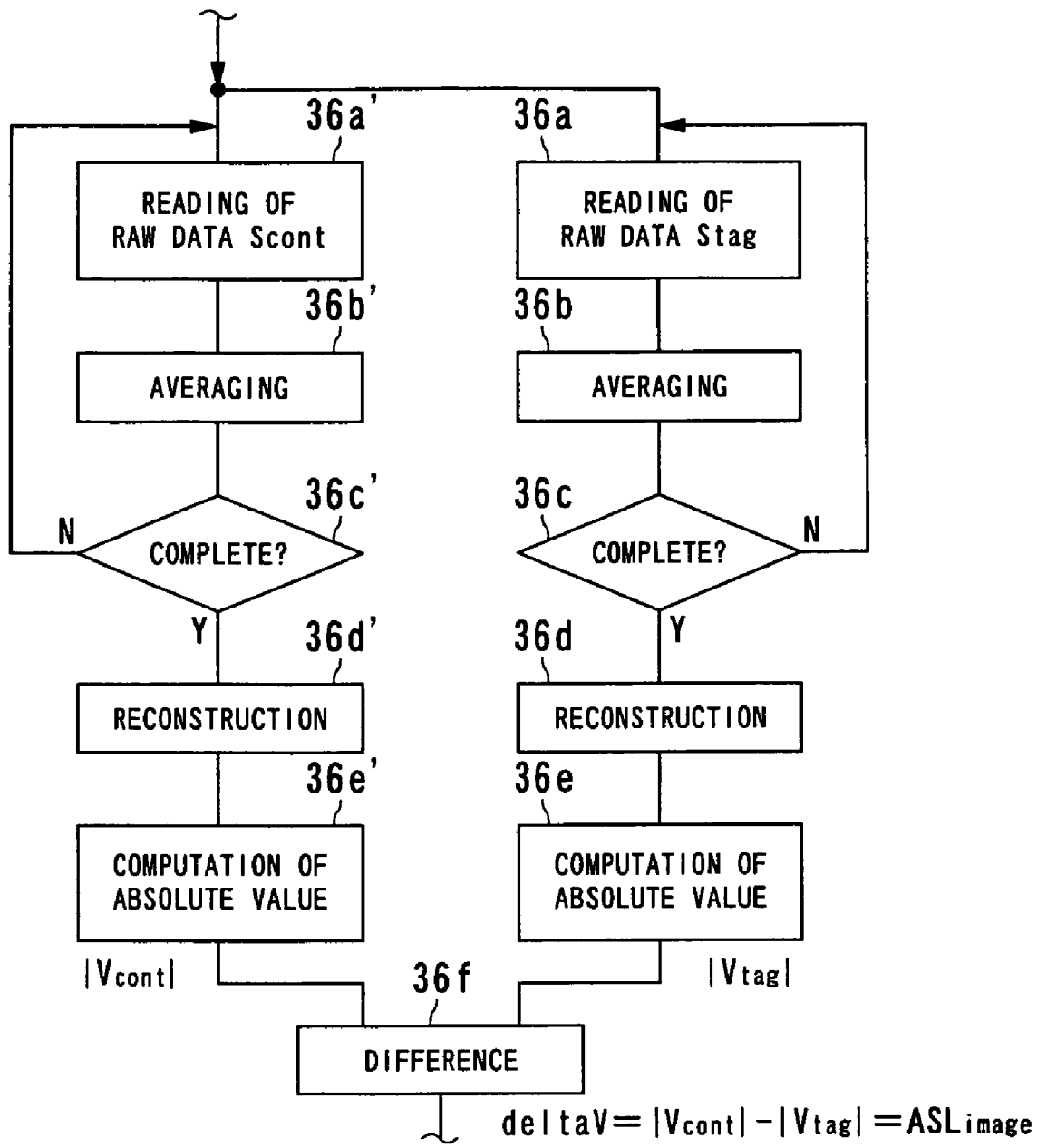
FIG. 11 is a schematic flowchart showing one example of the processing, from raw data acquisition to generation of an ASL image, performed in the first embodiment.

Upon receipt of the successively transferred echo data (raw data before reconstruction), the operational unit 10 performs, for example, processing shown in FIG. 11, and thereby obtains an ASL image, or namely a difference image. To be more specific, in each of the control mode and the tag mode, the operational unit 10 reads out raw data Scont (Stag), computes an average and reconstructs data for a plurality of shots, after which it computes the absolute value (Steps S36a' through S36e'; Steps S36a through S36e) As a result, the control image |Scont| in the form of the absolute value is obtained in the control mode, and the tag image |Stag| in the form of the absolute value is obtained in the tag mode.

Figure 12:
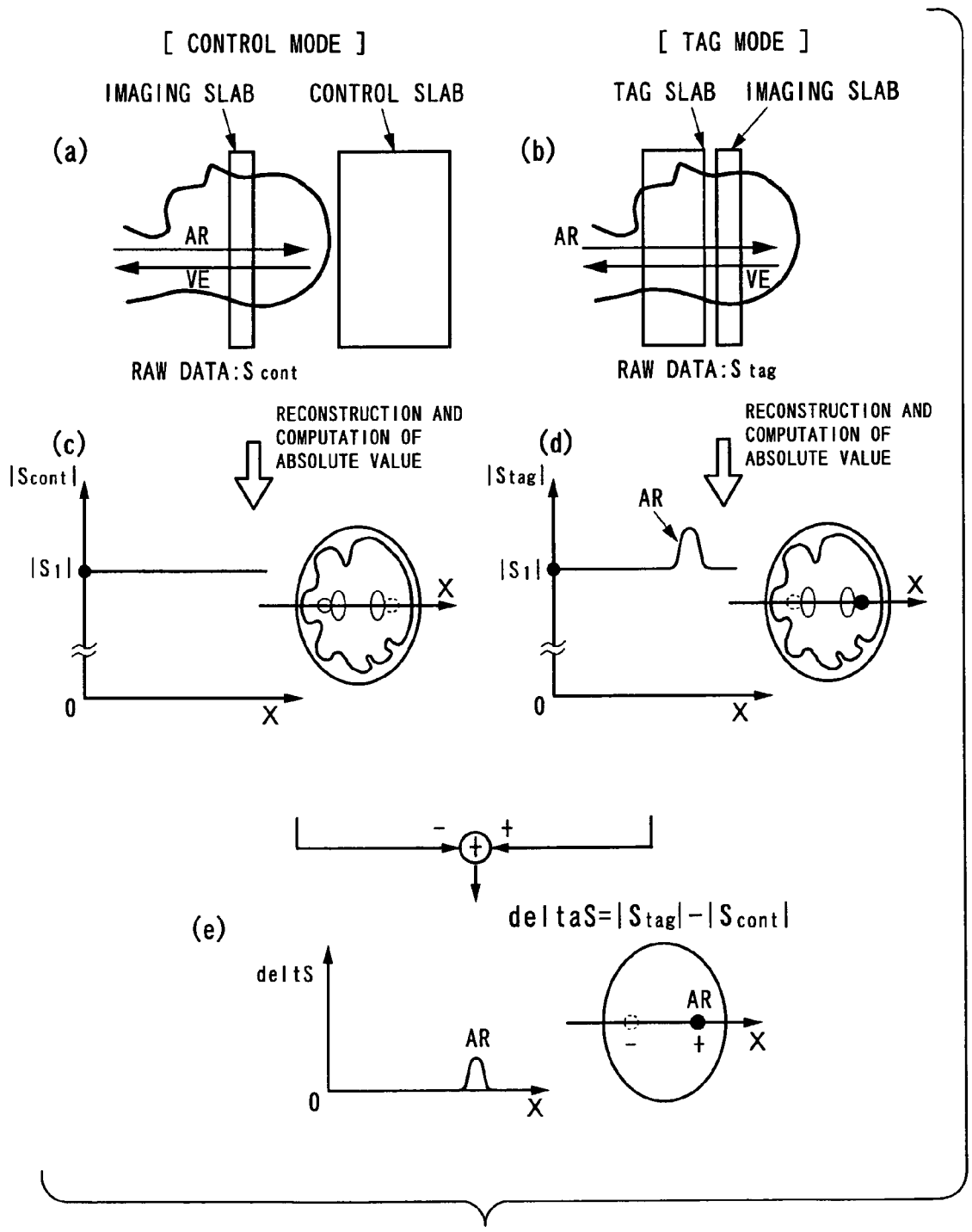
FIG. 12 is a view used to explain the concept of generation processing of an ASL image in the first embodiment.

The operational unit 10 then performs a difference operation, deltaS=|Scont|−|Stag|, pixel by pixel (Step S36f), and thereby obtains the ASL image ASL image. FIG. 12 schematically shows the flow involved with a series of steps up to imaging.

In this embodiment, the ASL image ASL image according to the BVS-ASL technique is obtained in the manner as described above. This ASL imaging has the characteristic as follows.

In this embodiment, a difference signal (a signal of the ASL image ASL image) between the control mode and the tag mode shows the cosine characteristic on the assumption of the laminar layer; however, it is possible to obtain a signal with the strength about two times higher than that of the sine characteristic of the unipolar-VENC type in a range from 0 to Venc. The magnitude of Venc has to be determined in response to the flow velocity range of an artery that needs to be labeled. In the case of the brain, when TI>1 sec. is to be set, the maximum value, 2*Venc, has to cover a flow velocity range from approximately 50 to 100 cm/sec. This requirement is satisfied by determining as Venc=Vmax/2.

On the other hand, when TI, a waiting time after the labeling, is short, it is not necessary to label an artery in so remote a region that it will not flow into the vascular bed within TI. It is sufficient to cover an artery in the region that will possibly flow into the vascular bed, and the SNR is thought to be enhanced by increasing the magnetization Mz for a slow flow velocity.

The inventor conducted an experiment to confirm the effect of the BVS-ASL technique, and an ASL image with a satisfactory SNR was obtained at TI=200 ms. even when Venc=12 cm/s.

Also, according to this embodiment, it is possible to reduce or eliminate the influence of the phase errors due to unbalanced spoiling of the transverse magnetization components caused by setting MPG=0 in the control mode, which was discussed above as one of the problems in the prior art. To be more specific, assume that the MPG pulse is included in the pulse sequences for both the control mode and the tag mode, and the both MPG pulses are the same, then the influence of such unbalanced spoiling of the transverse magnetization components can be cancelled by a difference. Because the BVS-ASL technique of this embodiment satisfies the above-specified condition, it is unsusceptible to the influence of the phase errors due to unbalanced spoiling of the transverse magnetization components as described above.

As has been described, given that v=Venc is of the same value, then the bipolar-VENC of this embodiment can attain the efficiency about two times higher than that of the unipolar-VENC without causing deterioration on the slow flow velocity side. Thus, although the velocity is two times higher than that of the unipolar-VENC, the efficiency is not lowered on the low flow velocity side, and the labeling efficiency around v=Venc is enhanced.

Figure 9:
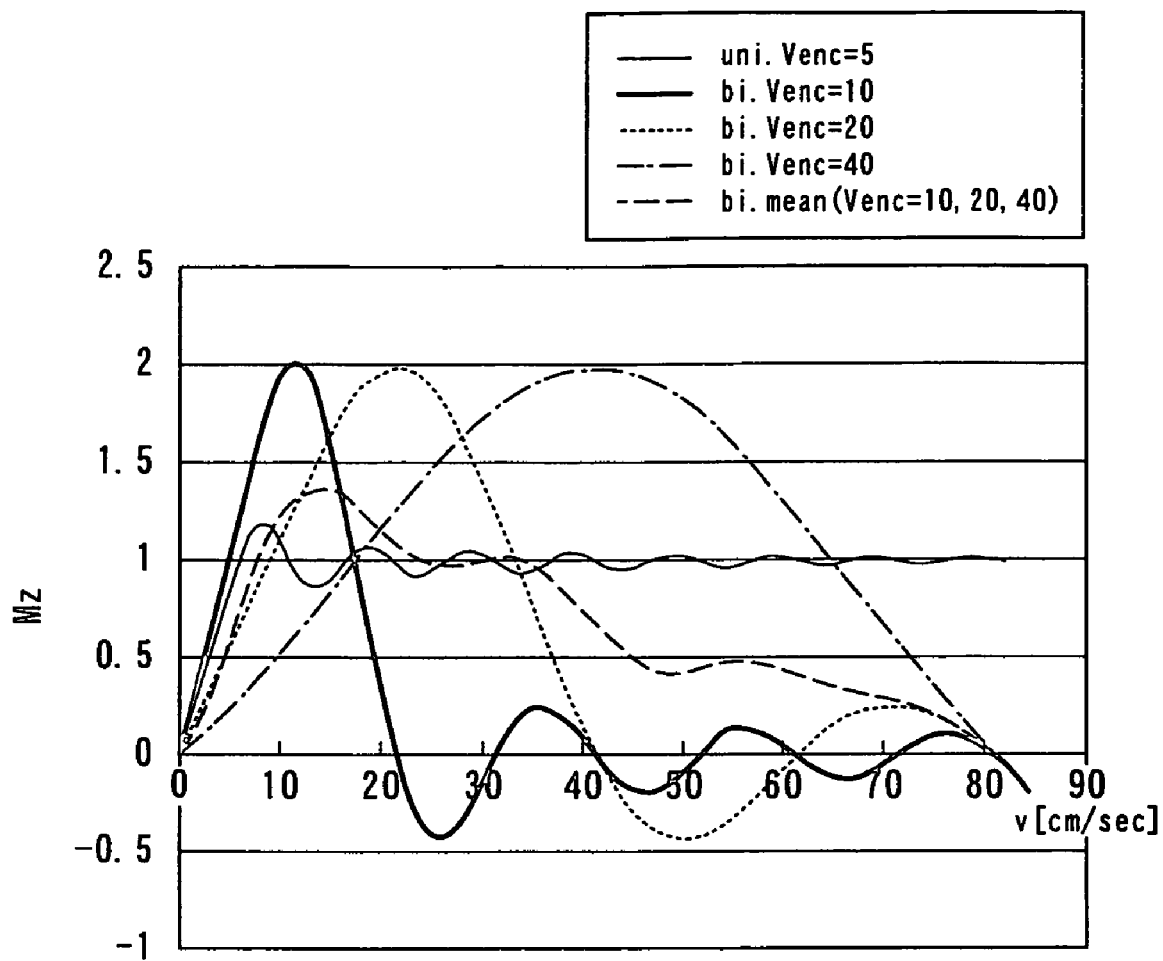
FIG. 9 is a graph showing magnetization Mz and a blood flow velocity v in the BVS-ASL technique in comparison with the conventional example.

Hence, if necessary, as a method of setting the characteristic of the magnetization Mz versus the flow velocity (Mz vs. velocity) shown in FIG. 9 into an arbitrary shape, a quantity of velocity encode by the velocity encode pulse may be made variable, so that the target flow velocity Venc varies with the number of acquisition (NAQ) for the averaging with the use of a storage table or the like. This makes it possible, for example, to provide the Mz characteristic with the weight being placed on the slow flow velocity side of the blood flow. In this case, by setting an input function to be of an edge enhancement type, it is possible to improve the rising characteristic in the low region of a response function, which is a convolution with the MTF (Modular Transfer Function) in the tissue blood flow model. To be more exact, it is possible to enhance the edge characteristic at the tip end of the labeled blood flow having flown into the vascular bed. A high SNR can be thus obtained even when TI is a short time.

In the BVS-ASL technique, the velocity-selective pulse is set so as to select a spatial slab as described above. On the other hand, when the BVS-ASL technique is used solely (when it is not combined with an SS-tag pulse as described below), the velocity-selective pulse may be set so as not to select a slab. In other words, it may be arranged in such a manner that the RF pulses are applied without accompanying the application of the gradient magnetic field in the slice direction.

Figure 20:
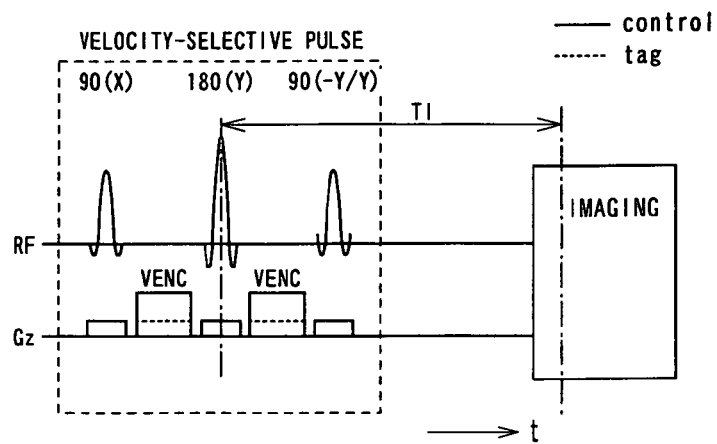
FIG. 20 shows a pulse sequence used to explain a modification of a velocity encode pulse.

Also, the velocity-selective pulses: BVS-pulses in the BVS-ASL technique shown in FIG. 4 through FIG. 6 can be further changed in shape. In other words, as a velocity-selective pulse providing the same effect as that of the velocity-selective pulse: BVS-pulse in terms of a reduction of phase errors owing to the spoiling of the transverse magnetization, a velocity encode pulse VENC to be applied during a series of pulse trains in this pulse may be set, for example, as shown in FIG. 20, to be of the same polarity and have asymmetrical strength between the control mode and the tag mode. When arranged in this manner, the labeling effect is more or less the same as that of the UVS-ASL technique; however, the effect by the spoiling of the transverse magnetization can provide an effect close to that of the BVS-ASL technique.

Second Embodiment

Figure 13:
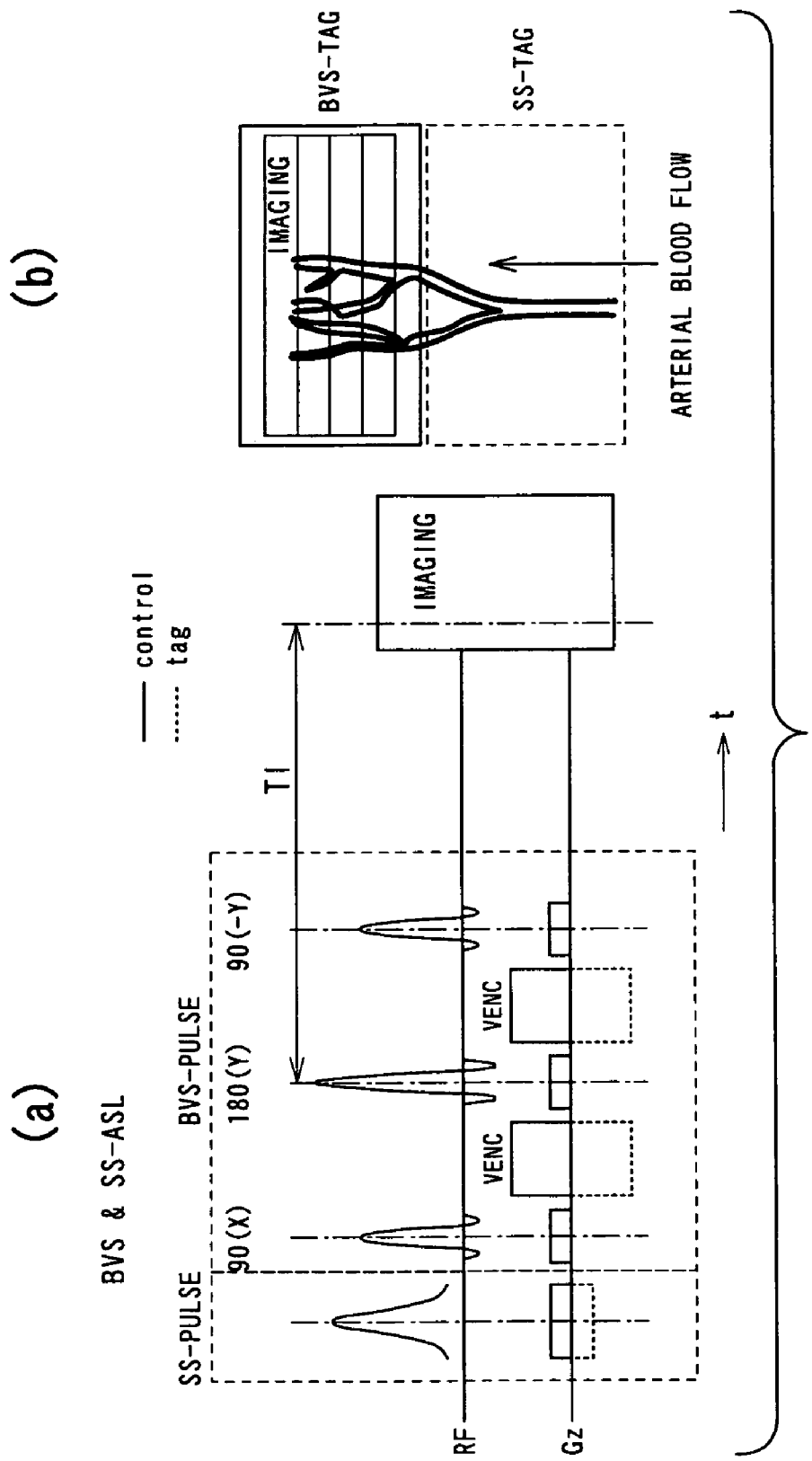
FIG. 13 is a view used to explain a schematic pulse sequence and the position of a tag slab, showing ASL imaging according to the BVS-ASL technique combined with the SS-ASL technique, performed in a second embodiment of the invention.

An MRI apparatus according to a second embodiment of the invention will now be described with reference to FIG. 13. For the MRI apparatus of this embodiment, the same or equivalent components as those of the MRI apparatus according to the first embodiment above are labeled with the same reference numerals, and the description of these components is omitted or simplified (the same can be said in third and following embodiments described below).

The MRI apparatus according to the second embodiment is characterized in that it is furnished with a function of performing the ASL imaging of the invention, and in particular, it is able to address a blood flow velocity in a wider range.

The ASL imaging performed in the second embodiment is a technique of reinforcing the BVS-ASL technique described above. When the BVS-ASL technique described above is performed solely, an artery having a high flow velocity outside the slab tagged by the velocity-selective pulse: BVS-pulse, BVS-tag (for example, see FIG. 4(b)), may not be labeled depending on the setting of the flow velocity v =Venc. Applying the velocity-selective pulse: BVS-pulse combined with the slice-selective pulse: SS-pulse, however, enables the labeling with sensitivity high enough for a flow velocity in a wider range. It should be noted that when velocity-selective pulse: BVS-pulse and the slice-selective pulse: SS-pulse are combined in this manner, a flow velocity v=Venc by the velocity-selective pulse: BVS-pulse has to be set to cover an artery having the highest flow velocity within the slab, BVS-tag. By setting in this manner, all the arteries included in the slabs labeled by the both pulses can be labeled.

FIG. 13(a) shows one example of a pulse sequence according to such a combination, and FIG. 13(b) shows the positional relation of a slice region tagged by the pulse sequence (in the tag mode). In the case of this pulse sequence, it is arranged in such a manner that the slice-selective pulse: SS-pulse is applied, followed by the velocity-selective pulse: BVS-pulse formed in the same manner as described above. As is shown in FIG. 13(b), the position of the slab tagged by the BVS-pulse, BVS-tag, is set to include, needless to say, a desired imaging slab as well as a gap between the imaging slab and the slab tagged by the slice-selective pulse, SS-tag. At the same time, the slab, SS-tag, is set to be positioned on the upstream side of an artery flowing into the imaging pulse and not to overlap the slab, BVS-tag.

It should be noted, however, that when the velocity-selective pulse: BVS-pulse and the slice-selective pulse: SS-pulse are combined, it is necessary to set in such a manner that the magnetizations Mz by the SS-ASL technique and the BVS-ASL technique are of the same polarity in both the control mode and the tag mode. In other words, to explain this together with the BVS-ASL technique described above, in a case where the tag pulse of the SS-ASL technique is an inversion pulse, it is necessary to set the polarity of the tag pulse in such a manner as to be positive in the control mode and negative in the tag mode. It is needless to say that the polarities may be reversed in each of the control mode and the tag mode.

The other configuration and the processing related to generation of an ASL image are the same as those of the first embodiment above. Hence, the second embodiment can achieve the same effects as those attained by the first embodiment above. In addition, by using the slice-selective pulse:

SS-pulse together, it is possible to attain an effect that a high visualization capability can be achieved with respect to a blood flow in a wider range of flow velocity.

In particular, in the case of applications for the brain that account for a largest portion of applications, it is often set in such a manner that a number of arteries having a slow flow velocity are included in the imaging slab, and the carotid artery or the origins of the anterior, middle, and posterior cerebral arteries having a high flow velocity are included in the outside of the imaging slab. Hence, covering both the inside and the outside of the imaging slab with separate tagging slabs as with this embodiment is a preferable setting that suits the actual circumstances. Because it is impossible to label arterial blood within the imaging slab with only the slice-selective slab, SS-tag, not the entire region can be covered; however, Td time-induced errors can be reduced compared with the case of using the slice-selective slab, SS-tag, alone.

Thus, the technique of this embodiment can be performed suitably in a case where it is desirable to label a blood flow on a higher velocity side than the blood flow range to be labeled by the BVS-ASL technique described above. Also, the technique of this embodiment is advantageous in that it is robust in terms of the settings of the velocity encode pulse VENC or the inversion time TI.

Further, according to the combining technique of the invention, the labeling efficiency can be enhanced by about two times compared with the case of using the UVS-ASL technique solely. Hence, assume that the TI time is the same, then the strength of magnetization Mz can be increased by about two times, and a blood flow image with an SNR enhanced by about two times can be obtained. On the other hand, the magnetization Mz of the same quantity can be obtained in half or less the TI time. Moreover, because the slab is selected, excitation of arterial blood in a remote region that has not flowed in can be suppressed, there is an advantage that a wait time needed for the recovery of the T1 time until the excitation for the following NAQ can be shorter. This increases time efficiency in regard to scan, and short-time measurement thereby becomes possible. Further, this effect is more significant in a case where a whole body transmission coil is used, because blood in the heart is also excited.

Instead of a 180° pulse incorporated in the velocity-selective pulse: BVS-pulse shown in FIG. 13, the sequence may be set so as to use two adiabatic pulses sequentially, which are widely used in enhancing the inversion efficiency of magnetization in the SS-ASL technique. By applying two pulses sequentially, not only can the phase characteristic be improved, but also the velocity encode pulse (MPG pulse) with smaller strength can be used because the pulses per se have the phase dispersion effect with respect to the flow. It should be noted, however, that this 180° pulse cannot be replaced by a single adiabatic pulse described above. This is because even when one adiabatic pulse is applied, the phase of the transverse magnetization does not converge immediately before the following 90° pulse.

Figure 14:
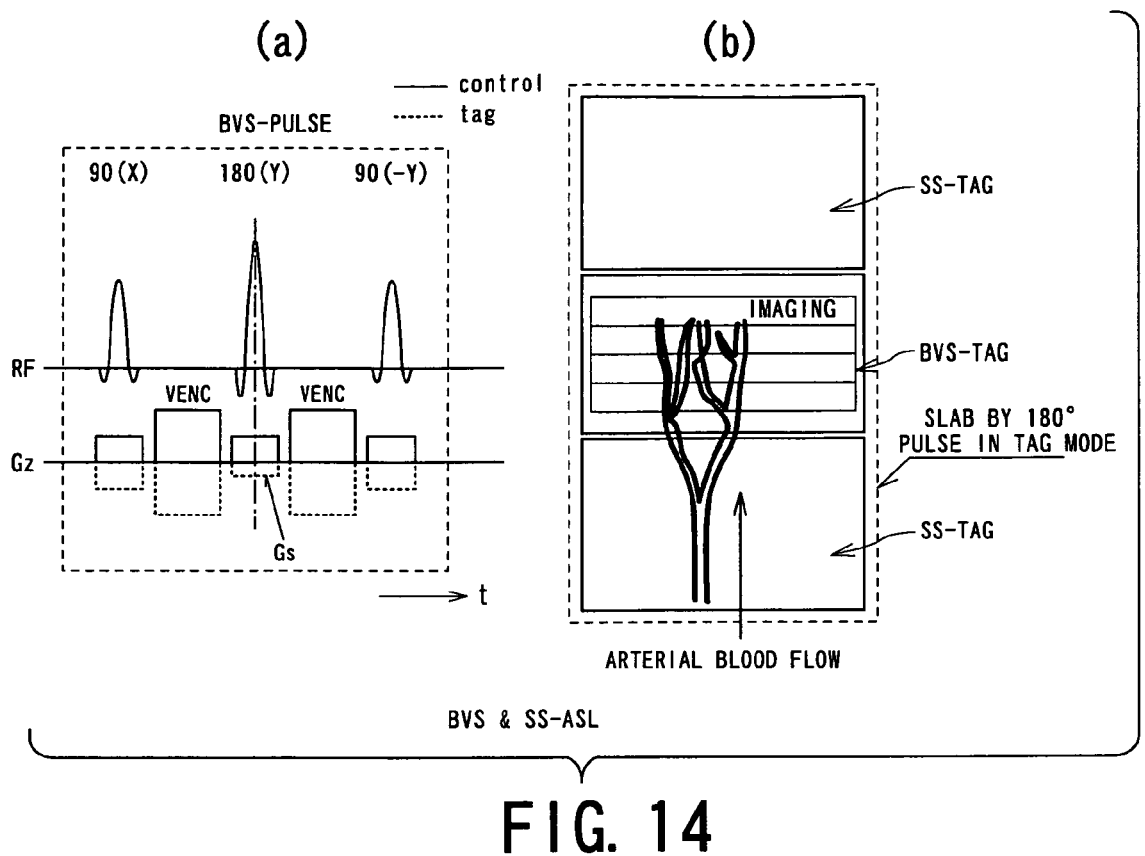
FIG. 14 is a view used to explain a schematic pulse sequence and the position of a tag slab, showing ASL imaging according to the BVS-ASL technique combined with SS-ASL technique, performed in a modification of the second embodiment.

FIG. 14 shows one example of a modified velocity-selective pulse: BVS-pulse, which is furnished with a function equivalent to the combination of the velocity-selective pulse: BVS-pulse and the slice-selective pulse: SS-pulse. In the case of the velocity-selective pulse: BVS-pulse shown in FIG. 14(a), the strength of the slice gradient magnetic field Gz applied together with the 180° pulse in the tag mode is set smaller than the strength of the slice gradient magnetic field Gz applied together independently with the 180° pulse in the control mode and the 90° pulses in the both modes. The tag slab by the 180° pulse in the tag mode thus becomes thicker as is shown in FIG. 14(b).

In other words the BVS-slab tagged by the velocity-selective pulse: BVS-pulse, BVS-tag, is a slab to which all the 90°, 180°, and 90° pulses are applied in the control mode. Hence, of a large slab to which the 180° pulse is applied in the tag mode, the both ends except for the BVS-slab, BVS-tag, function as the slice-selective slab, SS-tag. For this reason, in the case of the velocity-selective pulse: BVS-pulse shown in FIG. 14(a), not only can the effect equivalent to that of the velocity-selective pulse: BVS-pulse shown in FIG. 13(a) be achieved, but also the scan time can be shortened, without appending the slice-selective pulse: SS-pulse.

Third Embodiment

An MRI apparatus according to a third embodiment of the invention will now be described with reference to FIG. 15.

The ASL imaging performed by the MRI apparatus of this embodiment is characterized in that it performs slab selection although it is the non-slice-selective ASL imaging technique of the unipolar-VENC type.

Figure 15:
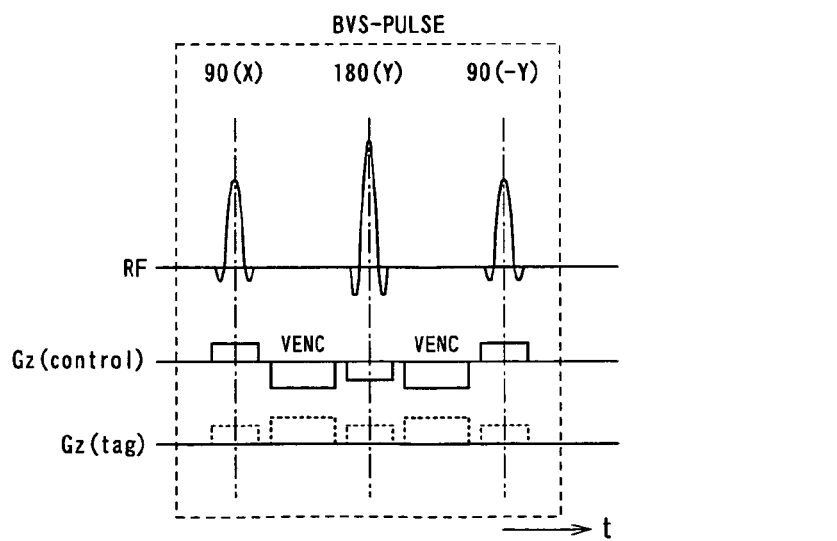
FIG. 15 shows a pulse train used to explain a velocity-selective pulse for ASL imaging performed in a third embodiment of the invention.

In order to realize such a characteristic, as is shown in FIG. 15, a pulse sequence is formed so that slab selection is performed with the use of a GMN (gradient moment nulling) pulse as the velocity-selective pulse: BVS-pulse.

When the slab selection is performed, the effect of the velocity encode (causing a phase to shift at a given velocity or higher) takes place in the control mode, and for this reason, the gradient magnetic field pulse for the slab selection is set to the GMN pattern. On the tag mode side, it is formed to give the velocity encode by the MPG pulse as with the embodiments above. This makes it possible to save the magnetization Mz of arterial blood in motion as well after subtraction between the tag image and the control image.

It is necessary for a practical MPG pulse to have an encoding function up to the velocity term, and further, by taking the arterial flow into account, it is preferable to form the MPG pulse as a pulse having the encoding function up to the accelerated velocity term. This makes it possible to save the magnetization Mz of the arterial blood in a wider range.

The configuration of the MRI apparatus and the processing involved in the ASL imaging are the same as those of the first embodiment above, except that the velocity-selective pulse: BVS-pulse for performing the slab selection with the use of the GMS pulse as described above, is applied.

Thus, different from the conventional non-slice-selective velocity-selective tag, VS-tag, not only the slice-selective tagging but also the velocity-selective tagging is performed in the MRI apparatus of this embodiment, which provides an effect that a repetition time TR during the scan can be shortened.

Fourth Embodiment

Further, an MRI apparatus according to a fourth embodiment of the invention will now be described with reference to FIG. 16A through 16D and FIG. 17.

The ASL imaging performed by the MRI apparatus of this embodiment is characterized that it is furnished with a function of adjusting a phase of the velocity-selective pulse (including the velocity-selective pulse: VS-pulse described in Article[5] and Article[6] above, and the velocity-selective pulse: BVS-pulse according the embodiments above).

Adjustment of the phase is crucial when incorporating the velocity selection into the pulse sequence for the MRI apparatus. In general, the phase of an RF pulse shifts from the logical value due to an eddy current or inhomogeneity of the magnetic field. Because a signal of an ASL image obtained on the basis of the cerebral blood flow is in the order of 0.1% or less of the control signal and the accuracy of about one tenth (0.01%) of that order is needed for quantification, phase adjustment in the order of 1° or less is required.

As with the embodiments above, assume that imaging is performed under the conditions that the Maxwell term is negligible, then compensation for the spatial 0-order and up to the first-order phase distributions within the range of the imaging slab is thought to be sufficient for the phase adjustment. Let $\phi_{er.cont}, \ldots, \phi_{er.tag}$ be the phase shifts of the transverse magnetization from the Y-axis when the velocity-selective pulse is applied in each of the control mode and the tag mode, then it is ideal that the condition, $\phi_{er.cont}=\phi_{er.tag}=0$, is established immediately before the last 90° pulse included in the velocity-selective pulse is applied. It is therefore an object of this embodiment to adjust the phase shifts, $\phi_{er.cont}, \ldots, \phi_{er.tag}$, to satisfy the above-specified condition.

In the case where the phase shifts, $\phi_{er.cont}=\phi_{er.tag}\neq 0$, delta Mz=0 is the difference signal between the control mode and the tag mode. In this case, however, the null point with respect to the blood flow is shifted (that is, flow≠0 at delta Mz=0), which is not preferable. A difference of the phase 1° described above is calculated as deltaMz/Mz=1−cos (1 deg)=0.0152%, which is a value almost satisfying the required accuracy.

One example of the phase adjusting method of the velocity-selective pulse described above will now be described. Another example of the phase adjusting method of the velocity-selective pulse will be described in an embodiment below.

In the fourth embodiment, the velocity-selective pulse: BVS-pulse used in the BVS-ASL technique as the ASL imaging technique described in the embodiments above, is used as an example, and a technique of measuring and compensating for the 0-order and first-order phase distributions by the gradient magnetic field and the flip phase will be described.

The velocity-selective pulse: BVS-pulse used as an example herein reverses, as shown in FIG. 4 and FIG. 5, the polarity of the velocity encode pulse VENC comprising the MPG pulse between the control mode and the tag mode while setting the phase (flip phase) of the second 90° pulse to be of the same polarity in both the modes.

In the case of such a velocity-selective pulse: BVS-pulse, the waveform pattern of the slice gradient magnetic field Gz differs between the control mode and the tag mode, which is thought to give rise to a phase shift that differs in each mode. It is therefore necessary to adjust the phase of the velocity-selective pulse: BVS-pulse in each mode according to the procedure as follows.

Figure 16A:
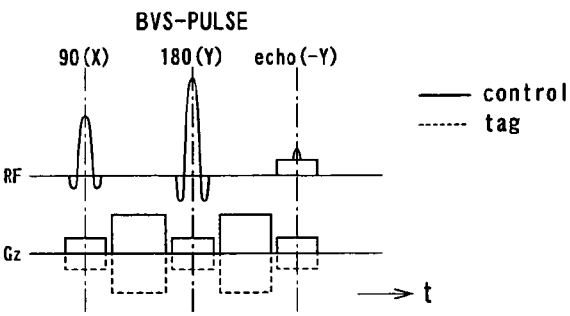
FIG. 16A through FIG. 16D are views used to explain the outline of a phase compensation method for a velocity-selective pulse in ASL imaging performed in a fourth embodiment of the invention.

The outline of such phase adjustment is as follows. That is, a pre-scan is performed in each of the control mode and the tag mode in order to measure the phase shift due to an eddy current. As shown in FIG. 16A, in this pre-scan is applied a pulse train including the gradient magnetic field Gz and of a measuring waveform pattern, which is the same waveform as the velocity-selective pulse: BVS-pulse described above (the waveform pattern same as the one used for data acquisition) except that neither the phase encode gradient magnetic field is applied nor the last 90° pulse is set. Thus, at the timing at which the last 90° pulse should be applied, echo signals S, on which no phase encoding is applied, are acquired while the spins remaining in the transverse magnetization.

Then, projection data P is computed by subjecting the echo signals S to the Fourier transform independently in each mode, and the phase distribution $\phi$ (Z) of the projection data P along the Z-axis direction is computed.

It is sufficient for the phase distribution $\phi$ to find the distributions up to the first-order in the gradient magnetic field direction. For this reason, the phases at the respective positions (respective slices) in the Z-axis direction may be computed from the projection data along the X-axis or Y-axis direction in the respective slices (Z position), so that the first-order distribution of the phase in the Z-axis direction is found from the phase value thus computed. Also, when necessity arises, a 3-D first-order phase distribution may be found from the projection data in the directions along all the X-, Y-, and Z-axes.

Figure 16B:
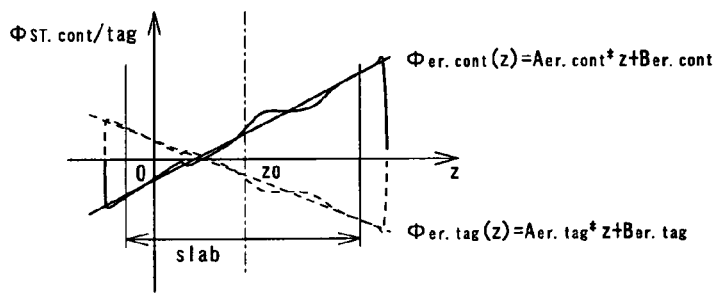

As is shown in FIG. 16B, the phase distribution is subject to fitting processing independently in each mode with the first-order equation, $\phi=Az+B$. A quantity of compensation for the phase adjustment can be found from this processing. A quantity of compensation for the gradient magnetic field Gz, Gz2, which is a quantity of first-order phase compensation, can be found from a gradient A of the first-order equation, on the assumption that compensation is added, for example, to the velocity encode pulse VENC, which is the second (latter) MPG. A quantity of 0-order phase compensation, $\phi$, may be the average phase of the slab or take a value at the center of the imaging slab, $Z=Z_0$, for the phase found through the fitting.

Figure 16C:
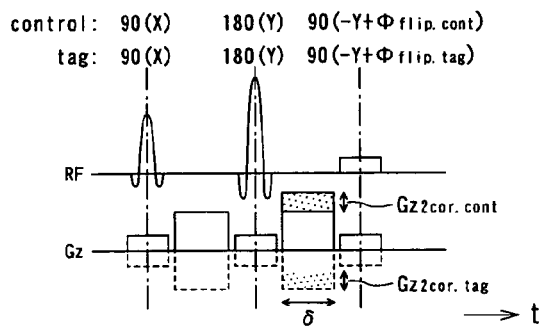

As is shown in FIG. 16C, the quantities of compensation thus found, (Gz2, $\Phi$), are reflected to the velocity-selective pulse: BVS-pulse during the main scan independently in each mode.

In other words, the compensation for the first-order phase, Gz2, is added, for example, to the latter velocity encode pulse VENC (MPG pulse) as the amplitude compensation for the gradient magnetic field Gz in the control mode and the tag mode, $Gz2_{cor.cont}$ and $Gz2_{cor.tag}$, respectively (because only the area value (time integral value) of the MPG needs to be matched, the duration of the gradient magnetic field Gz may be compensated instead of the amplitude; in short, compensation for the strength of the gradient magnetic field Gz is sufficient).

Figure 16D:
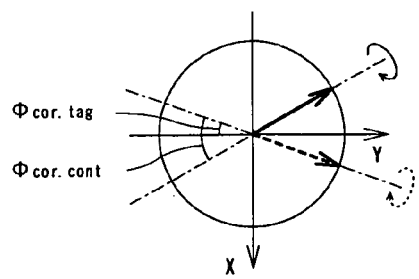

The compensation for the 0-order phase, $\Phi$, is added so as to adjust the phase of the second 90° pulse with respect to the −Y-axis. In other words, the phase of the 90° pulse with respect to the −Y-axis is adjusted to "−Y+$\Phi_{cor.cont}$" or "−Y+$\Phi_{cor.tag}$". Thus, as is shown in FIG. 16D, the spin having undergone the 0-order compensation is rotated about the rotational axis, "−Y+$\Phi_{cor.cont}$" (in the control mode) or "−Y+$\Phi_{cor.tag}$" (in the tag mode), in a clockwise direction when viewed from the positive direction of the respective rotational axes, and thereby causing the transverse magnetization to flip back to the longitudinal magnetization.

Figure 17:
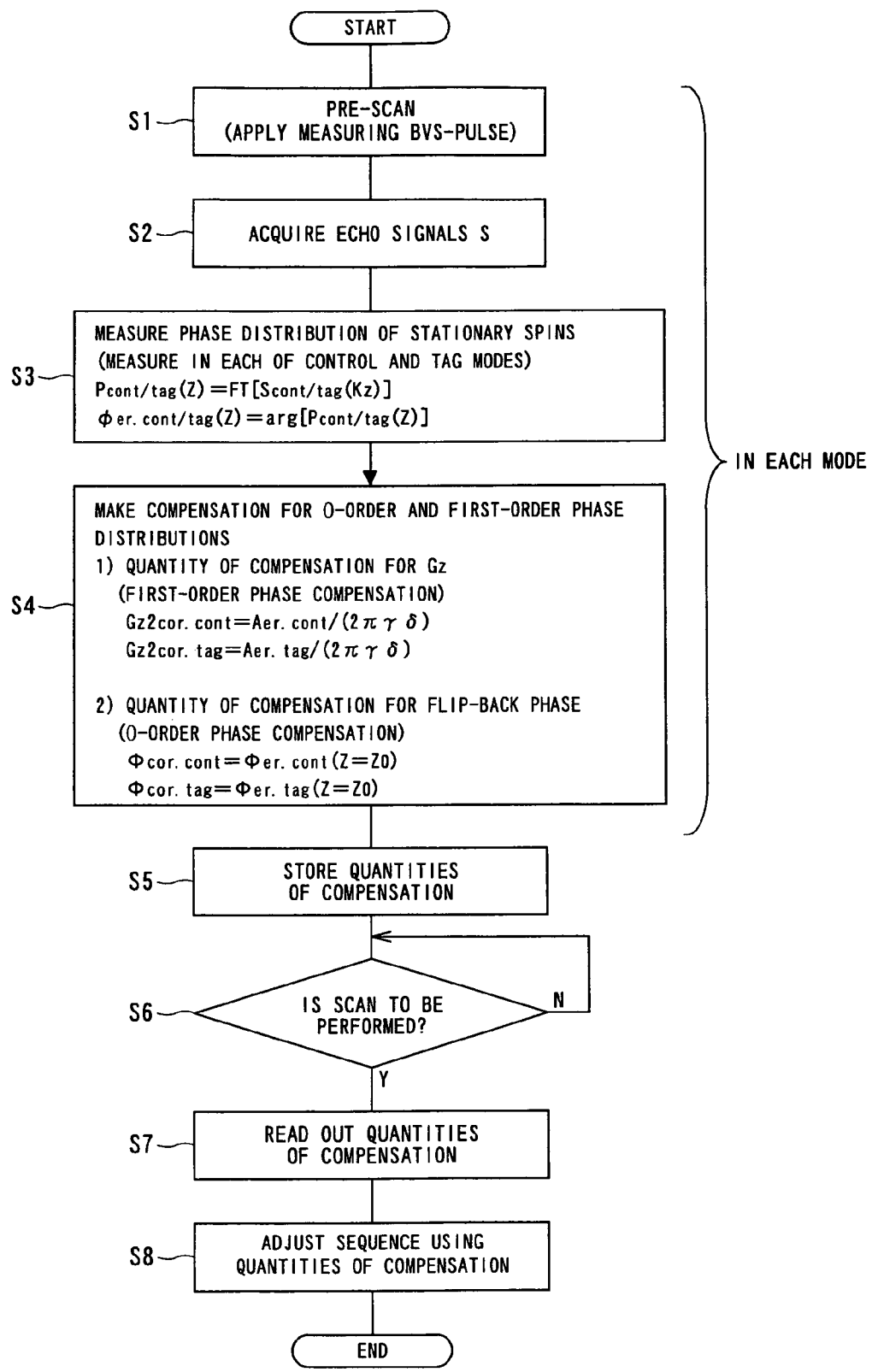
FIG. 17 is a flowchart showing the out line of the processing for the phase compensation method according to the fourth embodiment.

FIG. 17 shows the outline of the processing involved with the phase compensation described above. This processing is performed independently in the control mode and in the tag mode by using, for example, the sequencer 5, the host computer 6, and the operational unit 10 as the central units.

Initially, the sequencer 5 directs application of the measuring velocity-selective pulse: BVS-pulse (see FIG. 16A) described above as a pre-scan, and echo signals S are thus acquired (Steps S1 and S2 of FIG. 17). The host computer 6 or the operational unit 10 then computes the phase distribution (Step S3). That is, let $S_{cont}(Kz)$ be an echo signal in the control mode and $S_{tag}(Kz)$ be an echo signal in the tag mode, then projection data $P_{cont}(z)$ and $P_{tag}(z)$ are found through the Fourier transform by the following equation:

$$P_{cont/tag}(z)=FT[S_{cont/tag}(KZ)] \quad (1)$$

The phase distributions in the Z-axis direction in the control mode and the tag mode, $\phi_{er.cont}(Z)$ and $\phi_{er.tag}(Z)$, respectively, are found from the projection data $P_{cont}(z)$ and $P_{tag}(Z)$, respectively, by the following equation:

$$\phi_{er.cont/tag}(Z)=arg[P_{cont/tag}(Z)] \quad (2)$$

Subsequently, the host computer 6 or the operational unit 10 computes a quantity of compensation for the phase compensation using the first-order phase distribution described above (Step S4). To be more specific, quantities of compensation for the first-order phase compensation in the control mode and the tag mode, $GZ2_{cor.cont}$ and $Gz2_{cor.tag}$, respectively, are found by the following equations:

$$Gz2_{cor.cont}=A_{er.cont}/2(\pi\gamma\delta)$$

$$Gz2_{cor.tag}=A_{er.tag}/2(\pi\gamma\delta) \quad (3)$$

where $\gamma$ is a magnetic rotational ratio, and $\delta$ is a duration of the velocity encode pulse VENC (MPG).

Also, quantities of compensation for the 0-order phase compensation in the control mode and in the tag mode, $\Phi_{cor.cont}$ and $\Phi_{cor.tag}$, respectively, are found by the following equations:

$$\Phi_{cor.cont}=\phi_{er.cont}(z=z_0)$$

$$\Phi_{cor.tag}=\phi_{er.tag}(z=z_0) \quad (4)$$

The quantities of compensation thus found, ($Gz2_{cor.cont}$, $Gz2_{cor.tag}$, $\Phi_{cor.cont}$, and $\Phi_{cor.tag}$), are temporarily stored, for example, into the storage unit 11 (Step S5). The host computer 6 then judges whether the ASL imaging based on the BVS-ASL technique is to be performed, and upon judging that the ASL imaging is to be performed, the host computer 6 reads out the stored quantities of compensation (Steps S6 and S7). Subsequently, the amplitude or duration of the gradient magnetic field of the BVS-pulse as well as the phases of the RF pulses in the pulse sequence of this scan according to the BVS-ASL technique are compensated independently in each mode (Step S8) (see FIG. 16C). The phase of the RF pulse is generally controlled by controlling the carrier frequency; however, such control only has to be performed in either on the transmission side (transmitter 8T) or the reception side (receiver 8R), and it is sufficient to cause the phase to shift relatively.

The scan is performed according to the compensated pulse sequence.

As a consequence, it is possible to perform non-invasive blood flow visualization with high accuracy at a high SNR while eliminating markedly the influence of phase errors due to an eddy current or the inhomogeneity of the magnetic field.

In the case of the VS-ASL technique described in Article[6] above by Wong et al., and the VS-ASL technique using the GMN pulse described above, it is necessary to find quantities of compensation in each mode, because the polarity of the gradient magnetic field Gz differs between the control mode and the tag mode. Hence, the phase compensation processing is performed as with the fourth embodiment above for the VS-ASL technique of these types.

In order to measure phase errors in the background of the blood flow, measurement has to be performed using motionless, stationary components alone, and in the case of measurement with a living body having blood flows, the components of the flows need to be removed. Fortunately, when the brain is to be imaged, the blood flow components are approximately 3%, and compensation only has to be made in the signal before a difference between the control mode and the tag mode is computed. Even in this case, a serious error will not occur. Also, because the blood flow signal shows a large phase shift compared with the stationary region while phase errors in the background are being measured, the blood flow signal may be cut at the threshold or cut in a low-pass filter followed by fitting.

Fifth Embodiment

Further, an MRI apparatus according a fifth embodiment of the invention will now be described with reference to FIG. 18A through FIG. 18D and FIG. 19.

The ASL imaging performed by the MRI apparatus according to this embodiment is characterized in that, as with the fourth embodiment above, it is furnished with a function of adjusting the phase of the velocity-selective pulse. The velocity-selective pulse to be compensated is, as is shown in FIG. 6, a pulse: BVS-pulse in which the velocity encode pulse VENC comprising the MPG pulse is set to the same polarity in both the control mode and the tag mode and the phase (flip phase) of the second 90° pulse is inverted between the two modes.

In a case where the flip phase is inverted between the control mode and the tag mode and the same gradient magnetic field Gz is used in this manner, both the control mode and the tag mode are thought to show the same phase shift. Hence, the phase distribution involves only one measurement.

Figure 18A:
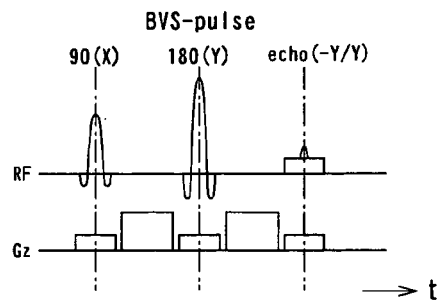
FIG. 18A through FIG. 18D are views used to explain the outline of the phase compensation method for a velocity-selective pulse in ASL imaging performed in a fifth embodiment of the invention.

The outline of the phase adjustment in this embodiment is as follows. That is, a pre-scan is performed in the control mode alone. As is shown in FIG. 18A, in this pre-scan is applied a pulse train including the gradient magnetic field Gz and of a measuring waveform pattern, which is the same waveform as the velocity-selective pulse: BVS-pulse described above except that the last 90° pulse is not set. Thus, at the timing at which the last 90° pulse should be applied, echo signals S are acquired while the spins remaining in the transverse magnetization.

As with the description above, the projection data P is computed by subjecting the echo signals S to the Fourier transform, and then the phase distribution $\phi$ of the projection data P along the Z-axis direction is computed, as the processing common in both the control mode and the tag mode.

Figure 18B:
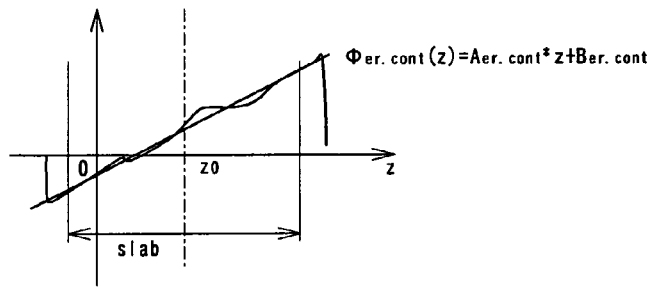

As is shown in FIG. 18B, the phase distribution is subjected to the fitting processing using the first-order equation, $\phi=Az+B$, as the processing common in the both modes. As with the description above, quantities of compensation for the phase adjustment are found from this processing. A quantity of compensation for the gradient magnetic field Gz, Gz2, which is a quantity of the first-order phase, can be found from a gradient A of the first-order equation on the assumption that compensation is added, for example, to the velocity encode pulse VENC, which is the second (latter) MPG. A quantity of the 0-order phase compensation, $\Phi$, may be the average phase of the slab or take a value at the center of the imaging slab, $Z=Z_0$, for the phase found through the fitting.

Figure 18C:
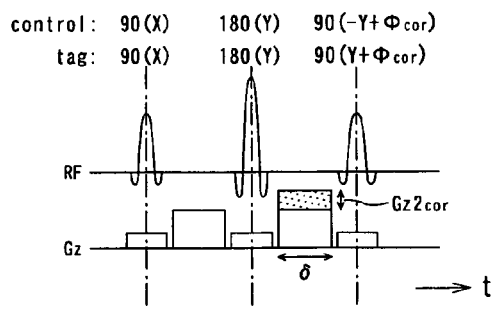

The quantities of compensation, (Gz2, $\Phi$), thus found are, as is shown in FIG. 18C, reflected to the velocity-selective pulse: BVS-pulse during the main scan in each of the control mode and the tag mode.

In other words, the compensation for the first-order phase, Gz2, is added commonly in both the control mode and the tag mode, for example, to the latter velocity encode pulse VENC (MPG pulse) as the amplitude (or duration) compensation for the gradient magnetic field Gz, $Gz2_{cor}$.

Figure 18D:
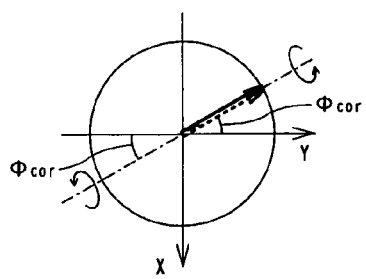

The compensation for the 0-order phase, $\Phi$, is applied so as to adjust the phase of the second 90° pulse with respect to the−Y-axis. In other words, the phase of the 90° pulse with respect to the−Y-axis is adjusted to "−Y+$\Phi_{cor}$" or "−Y+$\Phi_{cor.tag}$". Thus, as is shown in FIG. 18D, the spin having undergone the 0-order compensation is rotated about the rotational axis, "−Y+Φ$_{cor}$." (in the control mode) shifted from the −Y-axis by Φ$_{cor}$, or "Y +Φ$_{cor}$." (in the tag mode) shifted from the Y-axis by Φ$_{cor}$, in a clockwise direction when viewed from the positive direction of the respective rotational axes, and thereby causing the transverse magnetization to flip back to the longitudinal magnetization.

Figure 19:
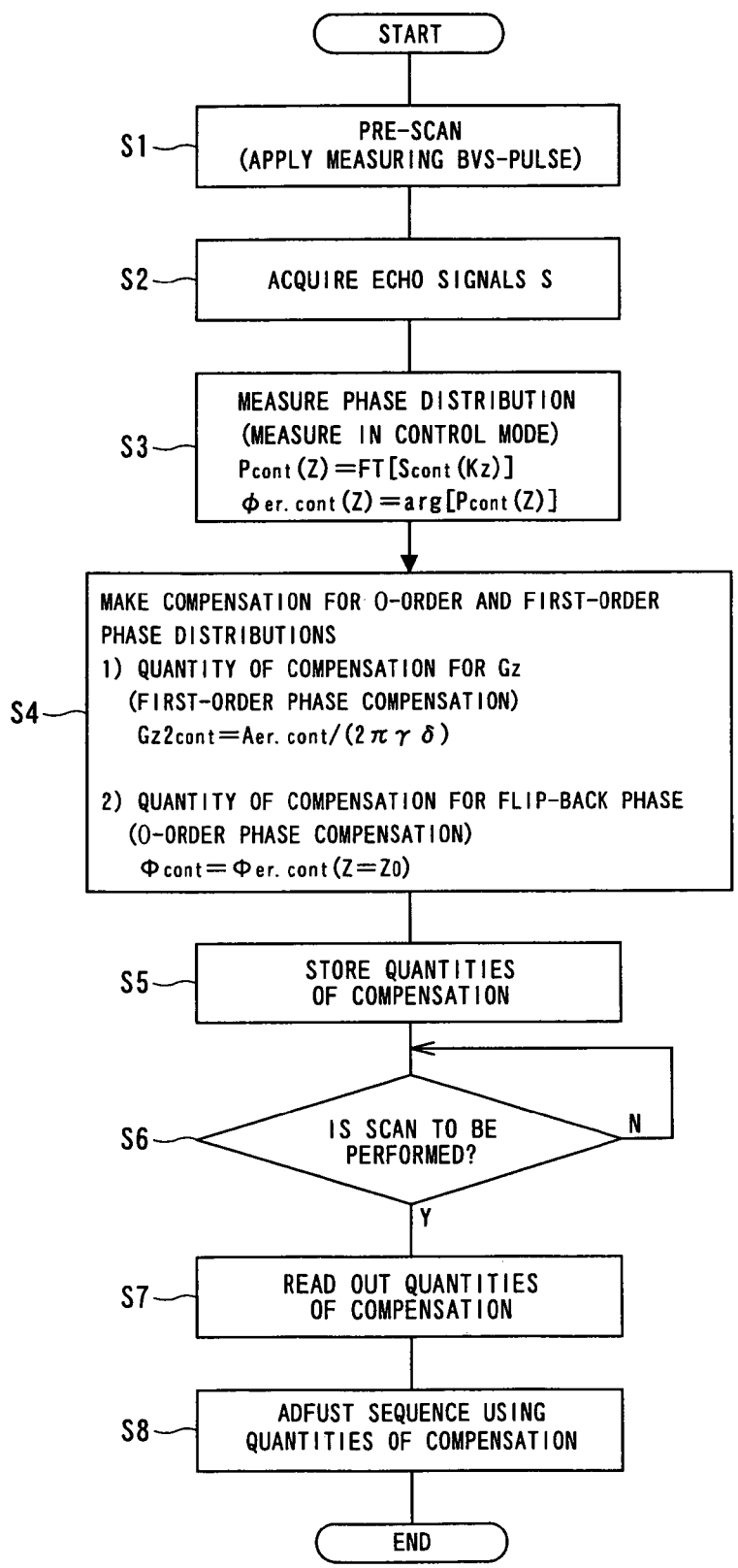
FIG. 19 is a flowchart showing the outline of the processing of the phase compensation method according to the fifth embodiment.

FIG. 19 shows the outline of the processing involved with the phase compensation described above. This processing is performed commonly for the control mode and the tag mode by using, for example, the sequencer 5, the host computer 6, and the operational unit 10 as the central units.

Initially, the sequencer 5 directs application of the measuring velocity-selective pulse: BVS-pulse (see FIG. 18A) described above as a pre-scan, and echo signals S are thus acquired (Steps S1 and S2 of FIG. 19). The host computer 6 or the operational unit 10 then computes the phase distribution (Step S3). That is, let S$_{cont}$(Kz) be an echo signal in the control mode, then projection data P$_{cont}$(z) is found through the Fourier transform by the following equation:

$$P_{cont}(z)=FT[S_{cont}(Kz)] \quad (5)$$

The phase distribution in the Z-axis direction, $\phi_{er.cont}(Z)$, is found from the projection data P$_{cont}$(z) by the following equation:

$$\phi_{er.cont}(z)=arg[P_{cont}(z)] \quad (6)$$

Subsequently, the host computer 6 or the operational unit 10 computes a quantity of compensation for the phase compensation using the first-order phase distribution described above (Step S4). To be more specific, a quantity of compensation for the first-order phase compensation, GZ2$_{cor}$, common in the both modes, is found by the following equation:

$$Gz2_{cor}=A_{er.cont}/2(\pi\gamma\delta) \quad (7)$$

where γ is a magnetic rotational ratio, and δ is a duration of the velocity encode pulse VENC (MPG).

Also, the quantity of compensation for the 0-order phase compensation, (Φ$_{cor}$, common in the both modes, is found from the following equation:

$$\Phi_{cor}=\phi_{er.cont}(z=z_0) \quad (8)$$

The quantities of compensation thus found, (Gz2$_{cor}$, Φ$_{cor}$), are temporarily stored, for example, into the storage unit 11 in the same manner as description above (Step S5). The host computer 6 then judges whether the ASL imaging based on the BVS-ASL technique is to be performed, and upon judging that the ASL imaging is to be performed, the host computer 6 reads out the stored quantities of compensation (Steps S6 and S7). Subsequently, the amplitude (or duration) of the gradient magnetic field of the BVS-pulse as well as the phases of the RF pulses in the pulse sequence of this scan according to the BVS-ASL technique are compensated independently in each mode (Step S8) (see FIG. 18C). The scan is performed according to the compensated pulse sequence.

As with the fourth embodiment above, it is thus possible to perform non-invasive blood flow visualization with high accuracy at a high SNR while eliminating markedly the influence of phase errors due to an eddy current or the inhomogeneity of the magnetic field. Further, this embodiment is more efficient than the fourth embodiment, because the measurement and computation of the quantities of compensation only have to be performed once.

The fourth and fifth embodiments above described the 0-order and first-order phase compensation method; however, second-order phase compensation is also possible. In a case where there is a second-order phase distribution that needs compensation, the shim coil 14 provided for homogenization of the static magnetic field can be used. The second-order phase distribution is computed from the MPG pattern for shimming the static magnetic field or measured in the pre-scan. For example, a $Z^2$ coil capable of generating a static magnetic field in the second-order distribution is used for a Gz-induced second-order distribution. Also, when the shim coil is used, compensation is possible even in the presence of a phase distribution of the Maxwell term. It should be noted, however, that the projection data used to measure the first-order or lower phase distribution is insufficient for use in the phase distribution measurement up to the second-order distribution. Hence, a 2-D image needs to be acquired and quantities of compensation are found from this image.

The phase compensation of the types described above are applicable to the ASL imaging of all the velocity-selective types. It is also possible for the phase compensation of these types to adopt a technique of finding and saving quantities of compensation in advance with the use of a phantom, and reading out the stored quantities of compensation to be used for the scan.

Meanwhile, the respective embodiments above can be changed in various manners in addition to the modifications described above.

For example, each of the embodiments above described a case where the region to be imaged is the head; however, the region to be imaged can be selected from various regions including the kidney, the liver, the muscle blood flow, etc.

Also, each of the embodiments above described the aspect using the velocity-selective pulse by the spin echo method; however, the invention is not necessarily limited to this aspect.

Figure 21:
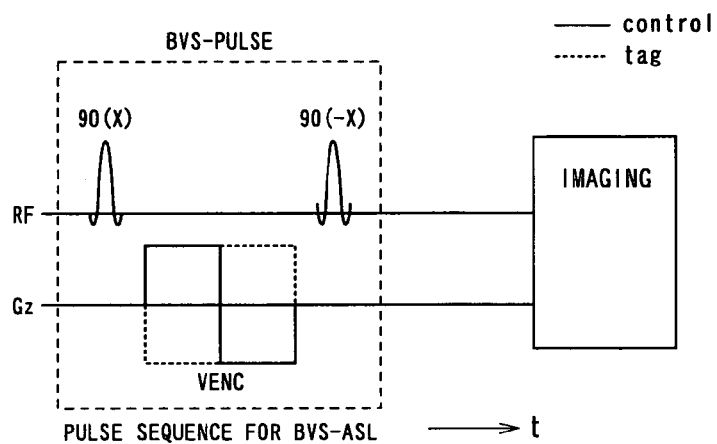
FIG. 21 shows a schematic pulse sequence used to explain one example of the BVS-ASL technique by the gradient echo method, feasible in all the embodiments of the invention.
Figure 22:
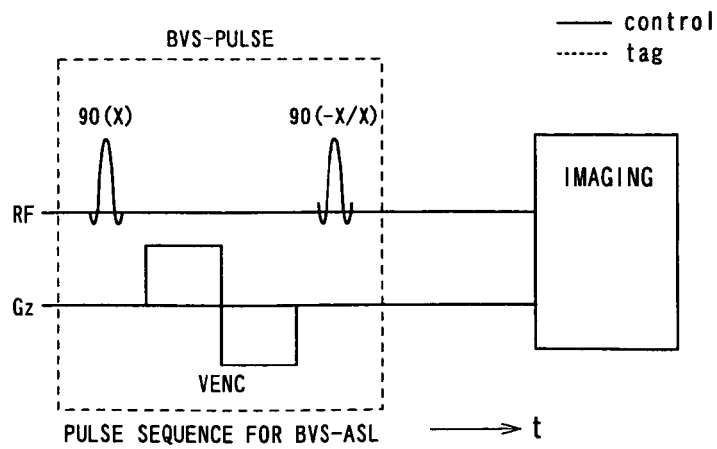
FIG. 22 shows a schematic pulse sequence used to explain another example of the BVS-ASL technique by the gradient echo method, feasible in all the embodiments of the invention.

In other words, as previously mentioned in the description of the first embodiment above, the invention can be performed with the use of the velocity-selective pulse by the gradient echo method instead of the velocity-selective pulse by the spin echo method. To be more specific, when the inhomogeneity of the static magnetic field is negligible, the velocity-selective pulse by the gradient echo method can be used. FIG. 21 and FIG. 22 show examples of the pulse sequence according to the BVS-ASL technique using the velocity-selective pulse: BVS-pulse by the gradient echo method.

The pulse sequence of FIG. 21 corresponds to FIG. 4(a) by the spin echo method described above, and the velocity encode pulse VENC (MPG pulse), in which the polarity is reversed between the control mode and the tag mode and the amplitude remains the same in the both modes, is applied. The pulse sequence of FIG. 22 corresponds to FIG. 6(a) described above, and the velocity encode pulse VENC (MPG pulse) having the same polarity in both the control mode and the tag mode is applied while using the inversion of the RF phase of the 90° pulse.

In a case where the velocity-selective pulse by the gradient echo method is used, different from the case of the spin echo method, the Maxwell term has to be taken into account.

That is, by setting the MPG pulse such that a difference Pc of the square integral of the gradient magnetic field becomes 0 as expressed by the equation below, the phase term of the Maxwell term is cancelled and the influence from this phase term can be eliminated almost completely:

$$Pc=\int[(G_{control}(t))^2-(G_{tag}(t))^2]dt\approx0 \quad (9)$$

Hence, artifacts in the background of the ASL image are prevented or reduced by eliminating phase errors due to the gradient magnetic field components in the directions other than the main magnetic field in an appropriate manner, which makes it possible to improve the image quantity.

As has been described above, according to the MRI apparatus and the ASL imaging technique performing the invention, it possible to overcome various problems in the conventional UVS-ASL technique.

To be more specific, by forming the velocity-selective pulse to be installed in the pulse sequence in such a manner that the transverse magnetization excited in each of the control mode and the tag mode gives rise to a phase shift in the opposite polarity upon velocity-selective excitation by the velocity-selective pulse, it is possible to provide the ASL imaging of the velocity-selective type capable of not only reducing Td time-induced errors, but also increasing the sensitivity by the labeling effect of magnetization as high as that of the existing SS-ASL technique.

In addition, by combining the selective excitation pulse and the velocity excitation pulse, a blood flow in a wide range from a low velocity to a high velocity can be labeled, which in turn makes it possible to provide the ASL imaging without having to limit the velocity range of a blood flow to be labeled.

Further, when the ASL imaging is performed using the velocity-selective pulse, the image quality and the visualization capability can be enhanced by adding compensation to the phase of the velocity-selective pulse.

Furthermore, because the MRI apparatus and the ASL imaging technique of the invention do not use a contrast medium, they are advantageous in that the non-invasiveness can be maintained and there is no risk of exposure to X-rays.

It should be appreciated that the invention is not limited to the embodiments described above by way of examples, and it is to be understood that changes and variations may be made by anyone skilled in the art without departing from the scope of the invention in light of the following claims, and such changes and variations belong to the invention.

What is claimed is:

1. An MRI apparatus configured to obtain an ASL (Arterial Spin Labeling) image of an image region to be imaged in a subject by performing scans independently in (a) a control mode, and (b) a tag mode according to an MRI pulse sequence based on an ASL technique, said apparatus comprising:
an MRI pulse sequence controller adapted to produce a pulse sequence which includes (a) a slice-selective pulse that spatially selects an upstream region outside said image region and excites transverse magnetization spins within said upstream region, and (b) a velocity-selective pulse train that selectively excites transverse magnetization spins having a constant velocity range in a region including said image region, and then performs excitation to cause the transverse magnetization spins to flip back to longitudinal magnetization,
said velocity-selective pulse train including a first flip pulse, an inversion pulse after said first flip pulse, a second flip pulse after said inversion pulse, a velocity encode pulse (a) after said first flip pulse and before said inversion pulse, and (b) after said inversion pulse and before said second flip pulse, and a gradient magnetic field pulse that is applied together with said first and second flip pulses as well as said inversion pulse to spatially select a region including said image region.

2. The MRI apparatus according to claim 1, wherein:
said upstream region resides on an upstream side of a fluid flowing into said image region and is adjacent to the region which is selected by said velocity-selective pulse train, without any gap between said regions.

3. The MRI apparatus according to claim 2, wherein:
said velocity encode pulse and a flip phase of said second flip pulse have magnitudes set in such a manner that the longitudinal magnetization of the magnetization spins in the fluid excited via said slice-selective pulse and said velocity-selective pulse train is of a same polarity in both of said control mode and said tag mode.

4. An MRI apparatus configured to obtain an ASL (Arterial Spin Labeling) image of an image region in a subject by performing scans independently in (a) a control mode, and (b) a tag mode according to an MRI pulse sequence based on an ASL technique, said apparatus comprising:
an MRI pulse sequence controller adapted to produce a pulse sequence which includes a pulse train that (a) spatially selects an upstream region outside said image region to be imaged and provides transverse magnetization spins within said upstream region, and (b) selectively excites transverse magnetization spins having a constant velocity range in a region including said image region causing the spins to undergo transition to transverse magnetization, and then performs excitation to cause the transverse magnetization spins to flip back to longitudinal magnetization spins,
said pulse train applying (i) a first flip pulse, (ii) an inversion pulse after said first flip pulse, (iii) a second flip pulse after said inversion pulse, (iv) a velocity encode pulse (a) in a period after said first flip pulse and before said inversion pulse, and (b) in a period after said inversion pulse and before said second flip pulse, and (v) a gradient magnetic field pulse together with said first and second flip pulses as well as said inversion pulse to spatially select a region including said image region.

5. A process for obtaining an ASL image of an image region to be imaged in a subject by performing scans independently in (a) a control mode, and (b) a tag mode according to an MRI pulse sequence based on an ASL technique, said method comprising:
providing an MRI pulse sequence controller, wherein the controller is configured to apply to said subject:
(a) a slice-selective pulse that spatially selects a region outside said image region and excites magnetization spins within said image region for the spins to undergo transition to transverse magnetization and thereafter
(b) applying a velocity-selective pulse train that selectively excites magnetization spins having a constant velocity range in a region including said image region for the spins to undergo transition to transverse magnetization, and then applying excitation to cause the transverse magnetization to flip back to longitudinal magnetization, followed by
(c) applying an imaging pulse train,
said velocity-selective pulse train including (a) a first flip pulse, (b) an inversion pulse after said first flip pulse, (c) a second flip pulse after said inversion pulse, (d) a velocity encode pulse (i) in a period after said first flip pulse and before said inversion pulse, and (ii) in a period after said inversion pulse and before said second flip pulse, and (e) a gradient magnetic field pulse applied together with said first and second flip pulses and said inversion pulse to spatially select a region including said image region;
there by generating an image of the subject.

6. An MRI method for obtaining an ASL (Arterial Spin Labeling) image of an image region to be imaged in a subject by performing scans independently in (a) a control mode, and (b) a tag mode according to an MRI pulse sequence based on an ASL technique, said method comprising:

providing an MRI pulse sequence controller, wherein the controller is configured to apply to said subject:

an ASL MRI pulse sequence which includes (a) a slice-selective pulse that spatially selects an upstream region outside said image region and excites transverse magnetization spins within said upstream region, and (b) a velocity-selective pulse train that selectively excites transverse magnetization spins having a constant velocity range in a region including said image region, and then performs excitation to cause the transverse magnetization spins to flip back to longitudinal magnetization, said velocity-selective pulse train including (a) a first flip pulse, (b) an inversion pulse after said first flip pulse, (c) a second flip pulse after said inversion pulse, (d) a velocity encode pulse (i) after said first flip pulse and before said inversion pulse, and (ii) after said inversion pulse and before said second flip pulse, and (e) a gradient magnetic field pulse applied together with said first and second, flip pulses as well as said inversion pulse to spatially select a region including said image region;

thereby generating an ASL image of the subject.

7. The MRI method according to claim 6, wherein:

said upstream region resides on an upstream side of a fluid flowing into said image region and is adjacent to the image region which is selected by said velocity-selective pulse train, without any gap between said regions.

8. The MRI method according to claim 7, wherein:

said velocity encode pulse and a flip phase of said second flip pulse have magnitudes set in such a manner that the longitudinal magnetization of the magnetization spins in the fluid excited via said slice-selective pulse and said velocity-selective pulse train is of a same polarity in both of said control mode and said tag mode.

9. An MRI method for obtaining an ASL (Arterial Spin Labeling) image of an image region in a subject by performing scans independently in (a) a control mode, and (b) a tag mode according to an MRI pulse sequence based on an ASL technique, said method comprising:

providing an MRI pulse sequence controller, wherein the controller is configured to apply to said subject:

an ASL MRI pulse sequence which includes a pulse train that (a) spatially selects an upstream region outside said image region to be imaged and provides transverse magnetization spins within said upstream region, and (b) selectively excites transverse magnetization spins having a constant velocity range in a region including said image region causing the spins to undergo transition to transverse magnetization, and then performs excitation to cause the transverse magnetization spins to flip back to longitudinal magnetization spins, said pulse train applying (i) a first-flip pulse, (ii) an inversion pulse after said first flip pulse, (iii) a second flip pulse after said inversion pulse, (iv) a velocity encode pulse (a) in a period after said first flip pulse and before said inversion pulse, and (b) in a period after said inversion pulse and before said second flip pulse, and (v) a gradient magnetic field pulse together with said first and second flip pulses as well as sad inversion pulse to spatially select a region including said image region; and generating an image of the subject, based on said ASL imaging process.

10. An ASL (Arterial Spin Labeling) imaging method for obtaining an ASL image of an image region to be imaged in a subject by performing scans independently in (a) a control mode, and (b) a tag mode according to an MRI pulse sequence based on an ASL technique, said method comprising:

providing an MRI pulse sequence controller, wherein the controller in configured to apply to said subject:

an ASL MRI pulse sequence which includes (a) a slice-selective pulse that spatially selects a region outside said image region and excites magnetization spins within said image region for the spins to undergo transition to transverse magnetization and thereafter (b) a velocity-selective pulse train that selectively excites magnetization spins having a constant velocity range for the spins to undergo transition to transverse magnetization, and then an excitation to cause the transverse magnetization to flip back to longitudinal magnetization, followed by (c) an imaging pulse train, said velocity-selective pulse train including (a) a first flip pulse, (b) an inversion pulse after said first flip pulse, (c) a second flip pulse after said inversion pulse, (d) a velocity encode pulse (i) in a period after said first flip pulse and before said inversion pulse, and (ii) in a period after said inversion pulse and before said second flip pulse, and (e) a gradient magnetic field pulse applied together with said first and second flip pulses as well as said inversion pulse to spatially select a region including said image region;

thereby generating an image of the subject, based on said ASL imaging process.

* * * * *